United States Patent [19]

Diorio et al.

[11] Patent Number: 5,914,894
[45] Date of Patent: Jun. 22, 1999

[54] METHOD FOR IMPLEMENTING A LEARNING FUNCTION

[75] Inventors: Christopher J. Diorio, Torrance; Paul E. Hasler, Pasadena; Bradley A. Minch, Pasadena; Carver A. Mead, Pasadena, all of Calif.

[73] Assignee: California Institute of Technology, Pasadena, Calif.

[21] Appl. No.: 09/088,655

[22] Filed: Jun. 1, 1998

Related U.S. Application Data

[60] Division of application No. 08/690,198, Jul. 26, 1996, Pat. No. 5,825,063, which is a continuation-in-part of application No. 08/399,966, Mar. 7, 1995, Pat. No. 5,627,392
[60] Provisional application No. 60/006,795, Nov. 15, 1995.

[51] Int. Cl.$^6$ ................................................ G11C 16/04
[52] U.S. Cl. ............................... 365/185.03; 365/185.18; 365/185.28
[58] Field of Search ..................... 365/185.03, 185.18, 365/185.28; 257/321

[56] References Cited

U.S. PATENT DOCUMENTS

| | | | |
|---|---|---|---|
| 4,622,656 | 11/1986 | Kamiya et al. | 365/51 |
| 4,653,928 | 3/1987 | Anderson et al. | 257/321 |
| 4,822,750 | 4/1989 | Perlegos et al. | 437/52 |
| 4,935,702 | 6/1990 | Mead et al. | 330/9 |
| 4,953,928 | 9/1990 | Anderson et al. | 257/321 |
| 5,059,920 | 10/1991 | Anderson et al. | 330/253 |
| 5,068,622 | 11/1991 | Mead et al. | 330/253 |
| 5,146,106 | 9/1992 | Anderson et al. | 365/185.03 |
| 5,160,899 | 11/1992 | Anderson et al. | 330/288 |
| 5,166,562 | 11/1992 | Allen et al. | 257/316 |
| 5,331,215 | 7/1994 | Allen et al. | 706/33 |
| 5,336,936 | 8/1994 | Allen et al. | 365/185.03 |
| 5,345,418 | 9/1994 | Challa | 365/185.17 |
| 5,463,348 | 10/1995 | Sarpeshkar et al. | 330/253 |
| 5,541,878 | 7/1996 | LeMoncheck et al. | 365/185.03 |
| 5,627,392 | 5/1997 | Diorio et al. | 257/321 |
| 5,687,118 | 11/1997 | Chang | 365/185.19 |
| 5,734,288 | 3/1998 | Dolazza et al. | 327/337 |
| 5,825,063 | 10/1998 | Diorio et al. | 257/321 |

OTHER PUBLICATIONS

Diorio, et al, "A High–Resolution Non–Volatile Analog Memory Cell", 1995 IEEE, pp. 2233–2235.
Gray, et al., "Analysis and Design of Integrated Circuits", Second Edition, pp. 67–71.
Hasler, et al., "An Autozeroing Amplifier Using PFET Hot–Electron Injection", 1996 IEEE.
Hasler, et al., "An Autozeroing Floating–Gate Amplifier", IEEE Journal of Solid State Circuits, Draft Copy, pp. 1–15.
Hasler, et al., "Single Transistor Learning Synapses", pp. 818–824.
Hasler, et al., "Single Transistor Learning Synapase with Long Term Storage", 1995 IEEE, pp. 1660–1663.
Hochet, et al., "Implementation of a Learning Kohonen Neuron Based on a New Multilevel Storage Technique", IEEE Journal of Solid–State Circuits, vol. 26, No. 3, Mar. 1991, pp. 262–267.
Hollis, et al., "A Neural Network Learning Algorithm Tailored for VLSI Implementation", IEEE Transactions on Neural Networks, vol. 5, No. 5, Sep. 1994, pp. 784–791.

(List continued on next page.)

Primary Examiner—David Nelms
Attorney, Agent, or Firm—D'Alessandro & Ritchie

[57] ABSTRACT

A three-terminal silicon MOS transistor with a time-varying transfer function is provided which may operate both as a single transistor analog learning device and as a single transistor non-volatile analog memory. The time-varying transfer function is achieved by adding or removing electrons from the fully insulated floating gate of an N-type MOS floating gate transistor. The transistor has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection.

24 Claims, 13 Drawing Sheets

OTHER PUBLICATIONS

Hu, et al., "Hot–Electron–Induced MOSFET Degradation–Model, Monitor, and Improvement", IEEE Transactions on Electron Devices, vol. ED–32, No. 2, Feb. 1985, pp. 375–385.

Ismail, et al., "Analog VLSI Signal and Information Processing", pp. 359–413.

Johnson, Colin R., "Neural Team Bares Silicon Brain", Electronic Engineering Times, Jul. 3, 1995, p. 1.

Johnson, Colin R., "Mead Envisions New Design Era", Electronic Engineering Times, Jul. 17, 1995, pp. 1, 37, 38.

Lazzaro, et al., Winner–Take–All Networks of O(N) Complexity, 1989, pp. 703–711.

Lazzaro, et al., "Systems Technologies for Silicon Auditory Models", IEEE 1994, pp. 7–15.

Leblebici, et al., "Hot–Carrier Reliability of MOS VLSI Circuits", pp. 46–49.

Minch, et al., "A vMOS Soft–Maximum Current Mirror", 1995 IEEE, pp. 2249–2252.

Masuoka, et al., "Reviews and Prospects of Non–Volatile Semiconductor Memories", IEICE Transactions, vol. E 74, No. 4, Apr. 1991, pp. 868–874.

Mead, et al., "Introduction to VLSI Systems", Addison–Wesley Publishing Company, Oct. 1980, pp. 1–5.

Mead, Carver, "Analog VLSI and Neural Systems", Addison–Wesley Publishing Company, Reading, MA, 1989, pp. 163–173.

Minch, et al., "Translinear Circuits Using Subthreshold Floating–Gate MOS Transistors", Analog Integrated Circuits and Signal Processing, 9, 167?? (1996), ©1996 Kluwer Academic Publishers, Boston, Manufactured in The Netherlands, pp. 167–179.

Sanchez, et al., "Review of Carrier Injection in the Silicon/Silicon–Dioxide System", IEE Proceedings–G, vol. 138, No. 3, Jun. 1991, pp. 377–389.

Sarpeshkar, et al., "White Noise in MOS Transistors and Resistors", 1993 IEEE, Nov. 1993; pp. 23–29.

Sarpeshkar, et al., "A Low–Power Wide–Linear–Range Transconductance Amplifier", Analog Integrated Circuits and Signal Processing, ©19?? Kluwer Academic Publishers, Boston, Manufactured in The Netherlands, pp. 1–28.

Tsividis, et al., "Continuous–Time MOSFET–C Filters in VLSI", IEEE Transactions on Circuits and Systems, vol. CAS–33, No. 2, Feb. 1986, pp. 125–140.

Tsividis, et al., "Design of MOS VLSI Circuits for Telecommunications", pp. 144–171.

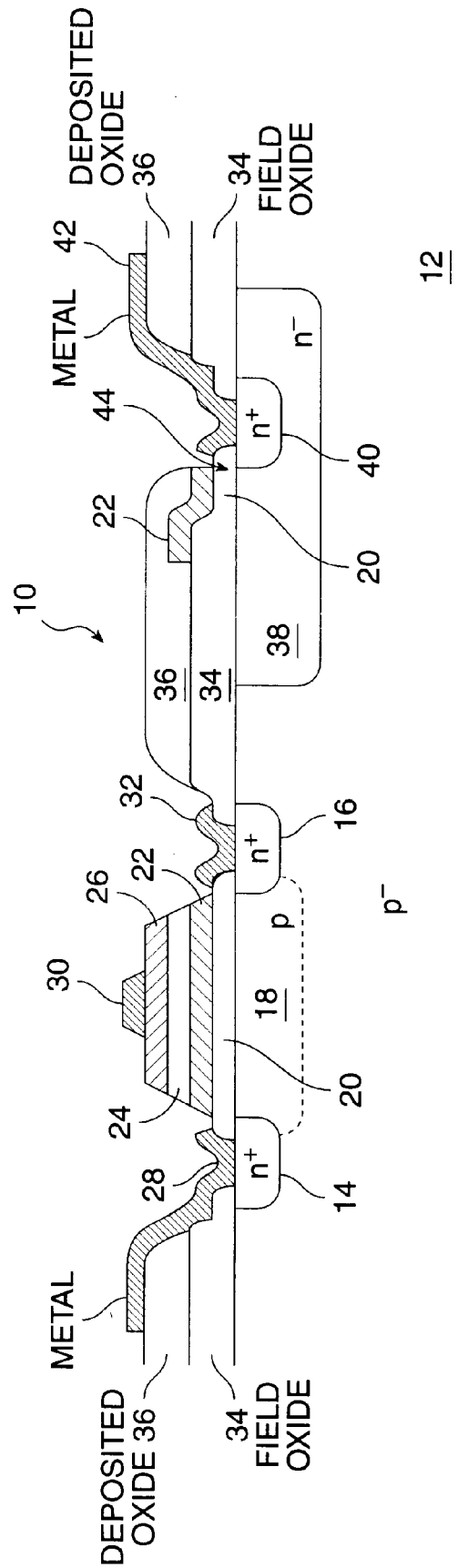

METHOD FOR IMPLEMENTING A LEARNING FUNCTION

REFERENCE TO RELATED APPLICATIONS

This is a divisional of prior application Ser. No. 08/690,198, filed Jul. 26, 1996, naming inventors Christopher J. Diorio, Paul E. Hasler, Bradley A. Minch and Carver L. Mead which is now U.S. Pat. No. 5,825,063, which is a continuation-in-part of Ser. No. 08/399,966, filed on Mar. 7, 1995, now U.S. Pat. No. 5,627,392.

This application claims the benefit of U.S. Provisional Patent Application Ser. No. 60/006,795, entitled "A Single Transistor Silicon Synapse", filed Nov. 15, 1995, in the name of inventors Christopher J. Diorio, Paul E. Hasler, Bradley A. Minch and Carver A. Mead, all assignors to the California Institute of Technology, a California non-profit Corporation,

STATEMENT AS TO RIGHTS TO THE INVENTION

The present invention was made with support from the United States Government under Grant number N00014-89-J-1675 awarded by the Office of Naval Research of the Department of the Navy and under Grant number N00014-89-J-3083 awarded by the Advanced Research Projects Agency of the Department of Defense. The United States Government has certain rights in the invention.

BACKGROUND OF THE INVENTION

1. Field of the Invention

The present invention relates generally to silicon structures for performing the learning function in neural networks and like systems. More particularly, the present invention relates to a single transistor analog floating gate MOS memory device which incorporates a capability for simultaneous memory reading and writing as part of the normal MOSFET device operation and which is suitable for performing long-term learning in silicon integrated circuits.

2. The Prior Art

One impediment to the development of silicon learning networks is the difficulty in storing analog weight values on-chip. Prior efforts typically used capacitive storage with clocked refresh, B. Hochet, et al., "Implementation of a Learning Kohonen Neuron Based on a New Multilevel Storage Technique," IEEE J. Solid-State Circuits, Vol. 26, No. 3, 1991, pp. 262–267, or storage of a multi-bit digital equivalent word, P. Hollis, et al., "A Neural Network Learning Algorithm Tailored for VLSI Implementation," IEEE Tran. Neural Networks, Vol. 5, No. 5, 1994, pp. 784–791. Both of these approaches pay a large price in terms of cell size, resolution, complexity and power consumption.

To achieve a substantial improvement over current technology silicon learning systems a single transistor learning device with the following attributes would be very valuable:

1. Non-volatile analog storage;
2. Bi-directional memory writing;
3. Support for simultaneous memory reading and writing;
4. On-chip read/write driver circuitry operating off of a single polarity voltage supply;
5. Low power consumption;
6. Compact size; and
7. Compatibility with standard silicon MOS processing.

Prior art floating gate transistors, which use electrical charge stored on a floating polysilicon gate embedded in an insulator such as silicon dioxide, provide suitable non-volatile analog storage. The charge on such a floating gate is known to remain fixed for periods of many years. Although the advantages of using floating gate transistors as memory elements are well known, J. Lazzaro, et al., "Systems Technologies for Silicon Auditory Models," IEEE Micro, Vol. 14, No. 3, 1994, pp. 7–15, T. Allen, et al., U.S. Pat. No. 5,166,562, entitled: "Writable Analog Reference Voltage Storage Device," their application to silicon learning networks has been limited. The principal reason has been the lack of a suitable bi-directional mechanism for writing the analog memory. Since the gate of a floating gate transistor is completely embedded within an insulator, writing the memory involves moving charge carriers through this insulator. Many mechanisms are known which will move electrons through an insulator. Two of the most common and most easily controlled methods are tunneling and hot-electron injection. The inherent difficulty in performing these operations has been the primary impediment to implementation of floating gate transistors in silicon learning systems.

The difficulty in transporting electrons across the barrier presented by the silicon/oxide interface is depicted in FIG. 1A. Surmounting the barrier requires that an electron possess more than about 3.1 eV of energy. At room temperature the probability that semiconductor electrons will possess this energy is exceedingly small. Alternatively, an electron could tunnel through this barrier; however, at the voltages and oxide thicknesses used in conventional silicon MOS processing, the tunneling probability is also exceedingly small.

Fowler-Nordheim tunneling involves applying a voltage across the oxide, as shown in FIG. 1B, which enhances the probability of an electron tunneling through it. Tunneling current versus oxide voltage for a 400Å $SiO_2$ gate oxide typical of a 2 $\mu$m MOS process is shown in FIG. 1C. Bi-directional currents through the oxide are required to achieve the learning and unlearning functions necessary in a silicon learning cell. Although the tunneling process has no preferred direction, bi-directional tunneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous memory reading and writing.

Single polarity bi-directional tunneling is often used in writing digital EEPROMs. Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog memory cell results in significant memory error.

Hot-electron injection is a process whereby electrons near the surface of a semiconductor acquire more than about 3.1 eV of energy, typically by acceleration in an electric field, and then surmount the silicon/oxide barrier. Once in the silicon dioxide conduction band, an electric field applied across the oxide carries these electrons to the floating gate. There are a number of ways of accomplishing hot-electron injection.

One source for a high electric field is the collector-to-base depletion region of either a vertical or lateral bipolar junction transistor (BJT). An example of a lateral BJT used in a similar application is shown in U.S. Pat. No. 4,953,928 to Anderson et al. Although this device is suitable for analog learning applications, each learning cell requires both an injection BJT and a MOSFET, the former to effect hot-electron injection and the latter to read the stored charge. A reduction in the number of transistors per cell would be highly desirable.

Another source for a high electric field is in the channel region of a split-gate n-type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel. Unfortunately, since the control gate modulates the injection rate but does not receive the injected charge, the memory cannot be both written and read simultaneously. Such a device is acceptable for digital EEPROMs but is unsuitable for analog learning cell applications.

A third source for a high electric field is the drain to source voltage dropped across the channel region of an above-threshold sub-micron n-type MOSFET. The disadvantage of this device is that in order to achieve injection, both the drain and gate voltages must exceed approximately 2.5 volts which results in a high channel current and consequent high power consumption.

A fourth source for high electric field is the drain to channel depletion region formed in an n-type MOSFET. In a conventional MOSFET, as depicted in FIGS. 2A–2B, this field only exists when the drain-to-source voltage exceeds 2.5 volts and the transistor is operated at or near its sub-threshold regime. Since subthreshold MOSFET gate voltages are typically less than one volt, electrons injected into the gate oxide encounter a large electric field directed towards the transistor drain, opposing their transport to the floating gate. The resulting charge transfer to the floating gate is negligibly small as can be seen in the FIG. 2B energy band diagram of the transistor of FIG. 2A.

Accordingly, there is a need for an improved silicon analog memory cell which can be written and erased, which can be written and read simultaneously, and which can be realized in a single device.

SUMMARY OF THE INVENTION

The present invention is a silicon MOS transistor suitable for learning applications and as a long-term memory storage device. It is presently embodied either as a four-terminal device or as a three-terminal device. Both embodiments of the present invention are functionally similar; except where noted, the following discussion is equally applicable to either device.

The present invention, in both embodiments, has a time-varying transfer function. By changing this transfer function the device can adapt to its environment; this is the essence of learning. By providing non-volatile memory storage, the device can indefinitely retain the information that it has learned, thereby providing a long term memory capability. It is useful as: an analog memory cell; in systems that learn signal correlations; in systems that adapt to changing environmental stimuli; and as a silicon analogue of a biological neural synapse.

The present invention, in both three-terminal and four-terminal embodiments, achieves a time-varying transfer function by adding and removing charge from the floating gate of an n-type MOS floating gate transistor. It has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection. The present invention achieves non-volatile memory by storing charge on the fully insulated floating gate of an n-type MOS floating gate transistor.

Fowler-Nordheim tunneling is used to remove electrons from the floating gate by applying a high voltage to either: a tunneling junction (for the four-terminal embodiment), consisting of an n+ doped implant embedded within a lightly-doped n– substrate implant; or, the n+ doped drain implant (in the case of the three-terminal embodiment), which is embedded within a lightly-doped n– substrate implant. The application of a high voltage removes electrons from the floating gate at a rate exponential with oxide voltage. When the high voltage is removed the tunneling rate becomes negligibly small.

Hot-electron injection is used to add electrons to the floating gate as follows: a moderately doped p-type implant is applied to the channel region of the n-type transistor during the fabrication process. This implant serves three functions. First, as compared with a conventional n-type MOSFET, this device experiences a higher electric field in the drain-to-channel depletion region. Second, the threshold voltage of the transistor is raised above 3.1 volts. Third, the drain-to-channel depletion region approximates a one-sided step junction. The higher field in the drain-to-channel depletion region results in a larger population of hot-electrons than is seen in conventional MOSFETs. At drain voltages exceeding the injection threshold, electrons will begin being injected into the gate oxide. The moderately doped p-type implant allows the device to be operated in the low power subthreshold regime at gate-to-source voltages above about 3.1 volts. Despite the channel implant, the device remains a fully functional MOS transistor.

The hot-electron injection rate varies with the transistor drain voltage and channel current. Drain voltage is typically used to enable or disable the injection process. For drain voltages exceeding about 10 volts, electrons are injected onto the floating gate. For drain voltages less than about 10 volts, the injection rate and the electron tunneling rate are both negligibly small, and the stored memory is retained in a nonvolatile state.

Hence, mechanisms are provided for adding electrons to and removing electrons from the floating gate resulting in a bi-directional memory writing capability. Electron injection is used to add electrons, electron tunneling is used to remove them. When the injection rate is greater than the tunneling rate, electrons are added to the floating gate, and the stored charge is reduced. When the tunneling rate is greater than the injection rate, electrons are removed, and the stored charge is increased.

Mechanisms are also provided by which to disable both processes, thereby retaining the stored, non-volatile analog memory. Furthermore, the device remains a fully functional n-type MOS transistor. The application of proper voltages to its drain, source and control gate terminals allows the reading of either its channel current or channel conductance, both of which are functions of its stored memory. These same terminal voltages determine whether the stored memory is being increased, decreased or held static. Therefore, simultaneous reading and writing is possible.

Accordingly, a single transistor non-volatile analog learning device is provided in two embodiments.

OBJECTS AND ADVANTAGES OF THE INVENTION

Accordingly, it is an object of the present invention to provide an improved analog memory cell.

It is a further object of the present invention to provide a single transistor analog memory cell.

It is a further object of the present invention to provide a memory cell capable of use in an extremely high density memory system.

It is a further object of the present invention to provide a single transistor analog memory cell that supports simultaneous memory reading and writing.

It is a further object of the present invention to provide a single transistor analog memory cell with a time-varying transfer function that is a component in the circuit used to write its own memory where the time-varying transfer function implements a learning function.

It is a further object of the present invention to provide a single transistor analog memory cell with a time-varying transfer function that is a component in the circuit used to write its own memory where the time-varying transfer function implements a learning function and the learning function defines a learning rule which can be used in the development of learning systems.

It is a further object of the present invention to provide a single transistor analog memory cell which can be simultaneously read from and written to.

It is a further object of the present invention to provide a single transistor analog memory cell which can support a feedback loop-type writing mechanism.

It is a further object of the present invention to provide a single transistor three-terminal device for storing analog values.

It is a further object of the present invention to provide a single transistor three-terminal device for manipulating stored values.

Yet a further object of the present invention is to provide an extremely low power, compact analog memory cell which can be incorporated into existing silicon integrated circuits and processes.

These and many other objects and advantages of the present invention will become apparent to those of ordinary skill in the art from a consideration of the drawings and ensuing description of the invention.

BRIEF DESCRIPTION OF THE DRAWINGS

FIG. 3A is a cross-sectional diagram of an analog memory cell according to a preferred embodiment of the four-terminal embodiment of the present invention taken along line 3A—3A of FIG. 3B.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The Four-terminal Embodiment

Figure 3B:
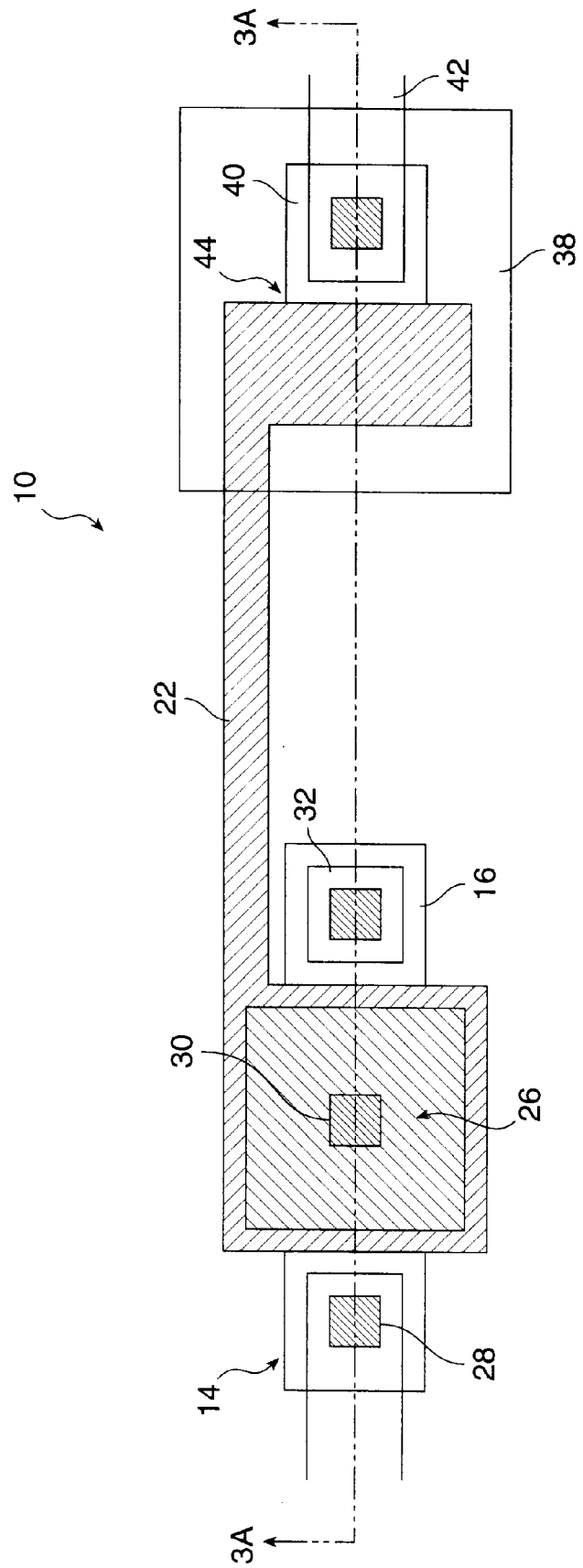
FIG. 3B is a top view of an analog memory cell according to the present invention, in the four-terminal embodiment.

The four-terminal embodiment of the present invention, illustrated in FIGS. 3A and 3B, is a silicon MOS structure for long term learning. It has been fabricated in an n-well, double poly, 2 μm silicon gate BiCMOS process, although other compatible process could be used as would be known to those of ordinary skill in the art.

FIG. 3B is a top view of the single transistor analog memory cell and FIG. 3A is a cross sectional view taken along line 3A—3A of FIG. 3B.

Figure 1A:
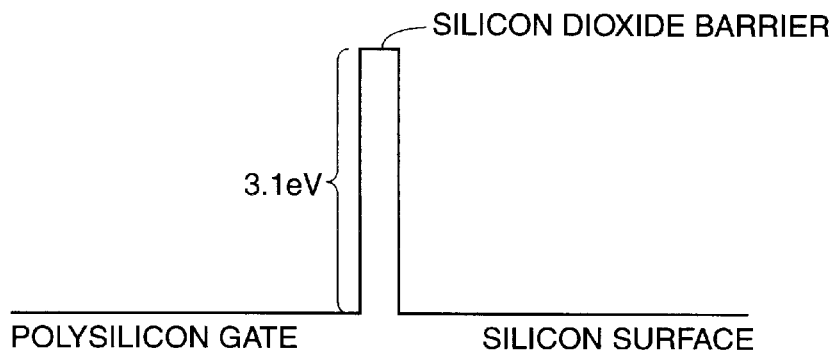
FIG. 1A Prior Art is an energy band diagram showing the potential barrier faced by a conduction electron at a silicon/oxide interface.
Figure 1B:
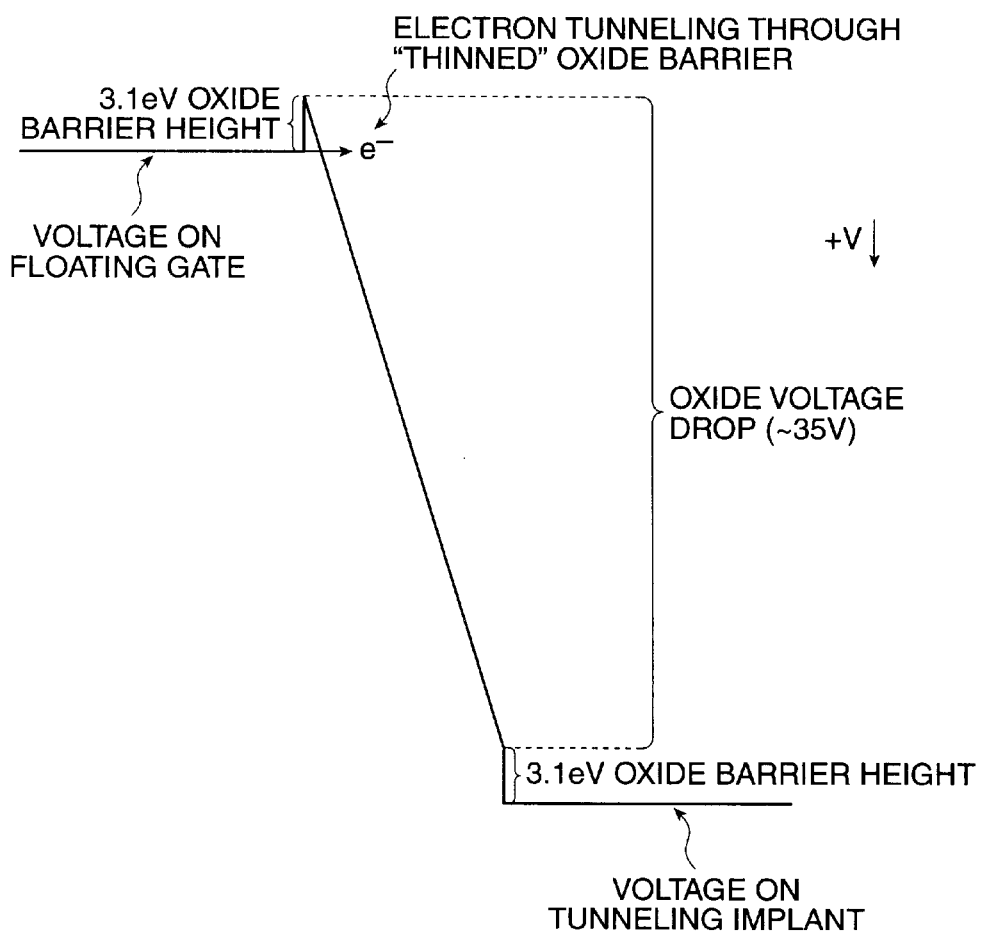
FIG. 1B Prior Art is an energy band diagram showing the potential faced by an electron in silicon attempting to pass through a silicon dioxide barrier in the presence of a Fowler-Nordheim tunneling potential.
Figure 1C:
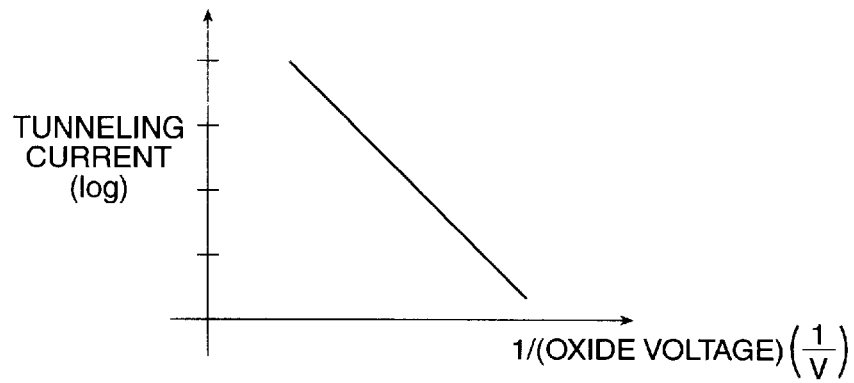
FIG. 1C Prior Art is a diagram showing a semi-log plot of tunneling current versus oxide voltage for a gate oxide tunneling junction.
Figure 2A:
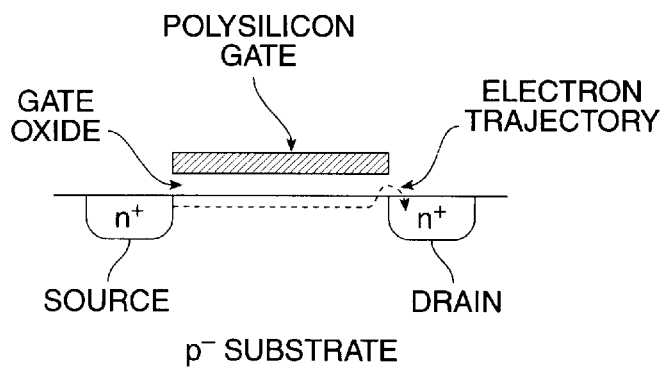
FIG. 2A Prior Art is a diagram of an n-type MOSFET showing the inability to inject electrons from the channel to the gate.
Figure 2C:
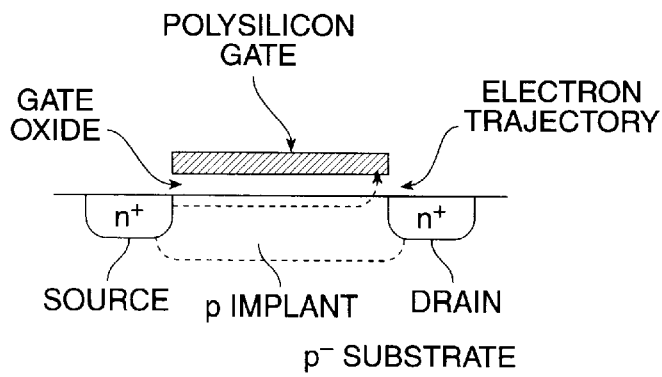
FIG. 2C is a diagram of an n-type MOSFET according to both three- and four-terminal embodiments of the present invention showing electron injection from the channel to the floating gate.
Figure 2B:
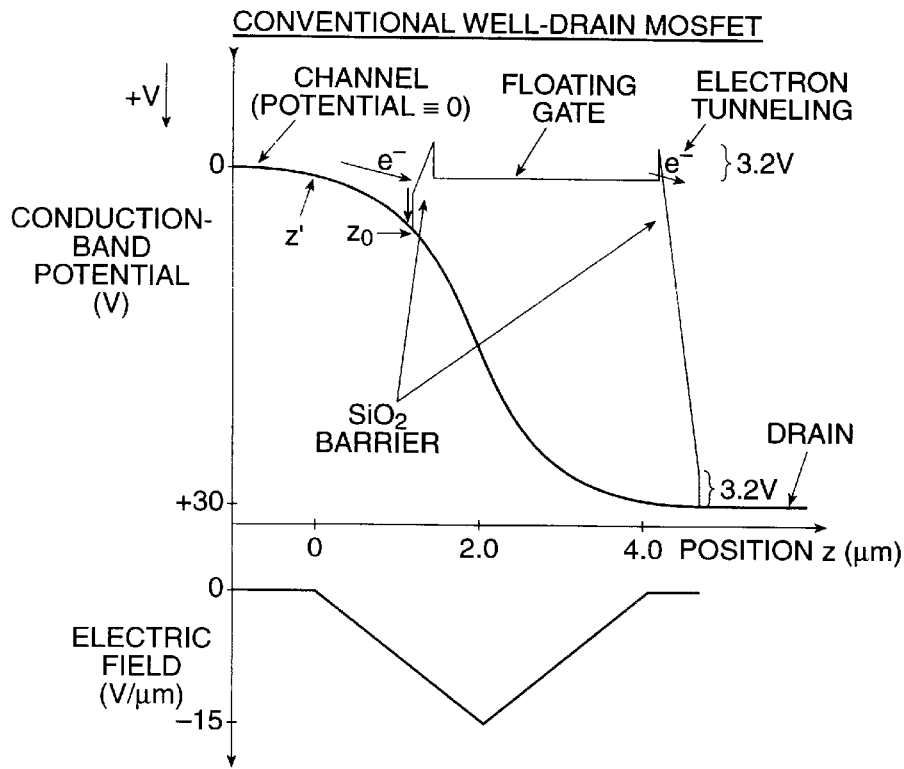
FIG. 2B Prior Art is an energy band diagram of the conventional n-type MOSFET described in FIG. 2A.
Figure 2D:
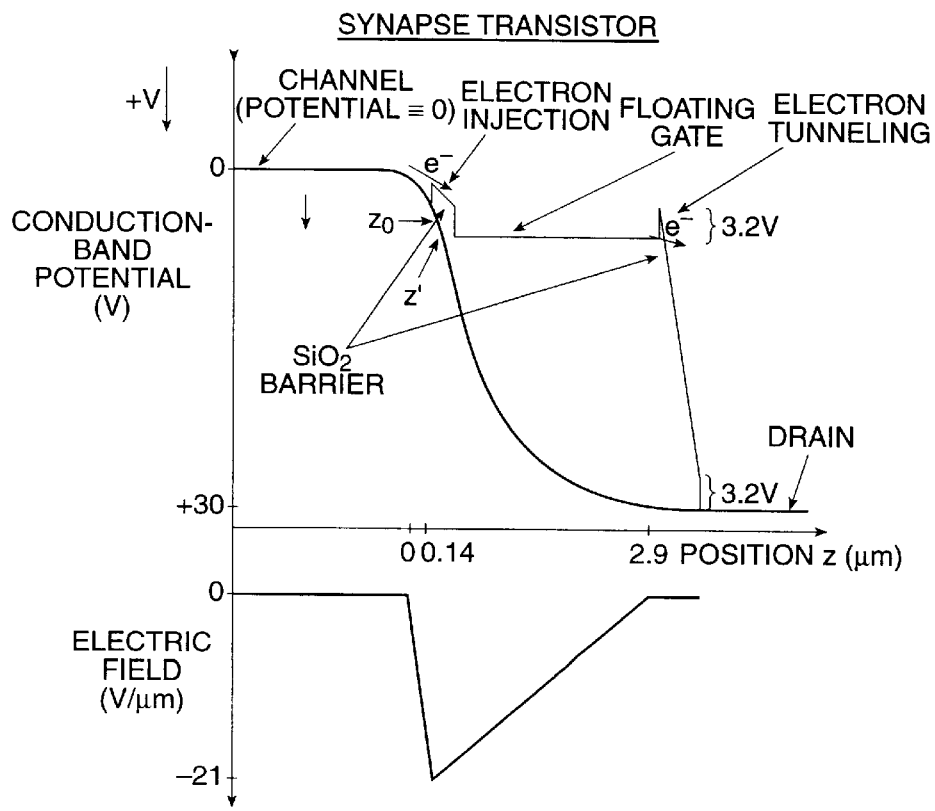
FIG. 2D is an energy band diagram showing electron injection from the channel to the floating gate of an n-type MOSFET analog memory cell according to both embodiments of the present invention with a p-base channel implant.
Figure 4:
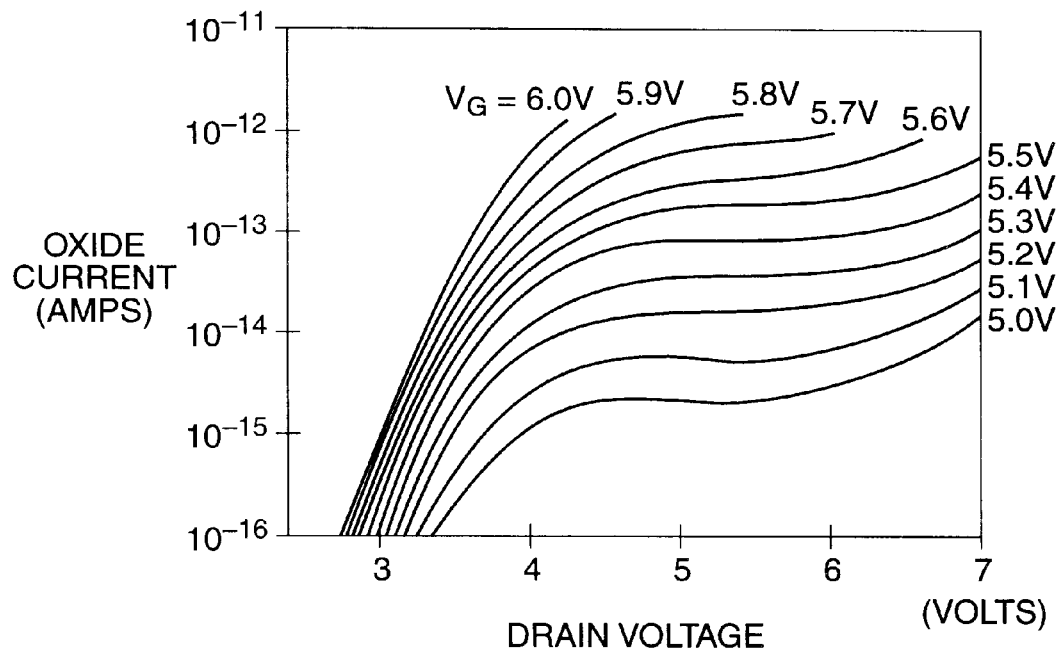
FIG. 4 is a plot of oxide current versus drain voltage in a 4 $\mu$m long, 6 $\mu$m wide injection transistor according to the present invention in a four-terminal embodiment, for several values of gate voltage.

Turning to FIG. 3A, the single transistor analog memory cell 10 is fabricated on a p– type region of semiconductor substrate 12. The floating gate transistor portion of single transistor analog memory cell 10 comprises n+ doped source implant region 14 within p– region 12, n+ doped drain implant region 16 within p– region 12, moderately doped p channel implant region 18, a gate oxide layer 20, a floating gate 22, an inter-poly oxide layer 24, a control gate 26, a source contact 28, a gate contact 30, and a drain contact 32. The p– substrate 12 is preferably doped to an impurity concentration of from about $3E14/cm^3$ to about $4E14/cm^3$. The n+ doped source implant region 14 and n+ doped drain implant region 16 are preferably doped to a level of between about $1E19/cm^3$ and about $1E20/cm^3$ with $1E20/cm^3$ presently preferred. The p channel implant region 18 is preferably doped to a moderate level using an implant such as p-base, the p type implant commonly used for the base region of a vertical bipolar transistor, with an impurity concentration in the channel of from about $1E17/cm^3$ to about $2E17/cm^3$ with $1E17/cm^3$ presently preferred. This implant permits the transistor to inject hot-electrons onto floating gate 22 with the drain 16 at or above about 2.5 volts and the floating gate 22 positive relative to the drain 16. This "injection" transistor has a 6 volt threshold, allowing sub-threshold channel currents at gate voltages high enough (e.g., +5 volts) to collect injected electrons. As indicated by the band diagram of FIG. 2D, by combining a large drain-to-channel electric field with high gate voltage in a sub-threshold transistor, the probability of injecting electrons onto the gate is greatly increased. Oxide current versus drain 16 voltage, for several values of gate voltage, are shown in FIG. 4.

Gate oxide layer 20 is thermally grown silicon dioxide of thickness preferably equal to or less than about 400Å. Floating gate 22 is preferably fabricated of a heavily doped conductive polysilicon, however another conductor could also be used as would be apparent to those of ordinary skill in the art. Inter-poly oxide layer 24 is preferably equal to or less than about 750Å and may be deposited in any convenient manner. Control gate 26 is preferably fabricated of a heavily doped conductive polysilicon, however another conductor could also be used as would be apparent to those of ordinary skill in the art. Contacts 28, 30 and 32 are preferably metal such as aluminum or another suitable conductor. The floating gate 22 transistor portion of single transistor analog memory cell 10 is surrounded by a layer of field oxide 34 and a layer of a deposited oxide 36.

In typical use, transistor 10 has its source 14 tied to ground and its drain 16 tied to a potential which may be varied between a potential above about 2.5 volts and a potential below about 2.5 volts. The substrate 12 is at ground. A voltage applied to control gate 26 with respect to ground causes an intermediate voltage on floating gate 22.

The second portion of single transistor analog memory cell 10 comprises a tunneling junction adapted to allow removal of electrons from floating gate 22. A tunneling implant region 38 is preferably a lightly doped n– region with an impurity concentration of from about $1E16/cm^3$ to about $2E16/cm^3$ with $1E16/cm^3$ presently preferred. Within tunneling implant 38 is an n+ implant plug 40, of impurity concentration of from about $1E19/cm^3$ to about $1E20/cm^3$, with $1E20/cm^3$ presently preferred. This plug performs two functions. First, it allows contact 42, preferably fabricated of metal or another suitable electrical conductor, to form an electrical connection to lightly doped tunneling region 38. Second, it provides a source for tunneling electrons. Floating gate 22 extends adjacent to and, as a consequence of n+ impurity diffusion during the fabrication process, slightly over plug 40. Floating gate 22 is separated from plug 40 by a region of gate oxide 20, forming tunneling junction 44. Electron tunneling from floating gate 22, through gate oxide region 44, to plug 40, is greatly facilitated as compared with tunneling from floating gate 22, through gate oxide 20, to tunneling implant 38.

In order to remove electrons from floating gate 22, a sufficiently high voltage, e.g., +35 volts relative to ground for a 400Å gate oxide is applied to plug 40 via contact 42. The large positive voltage creates a favorable environment for electron tunneling from the relatively negative floating gate 22 to plug 40, removing electrons from the floating gate 22.

The purpose of lightly doped tunneling implant region 38 is to permit application of a high voltage to plug region 40. The use of lightly doped implants in high voltage applications in order to increase the reverse-bias breakdown voltage of pn-junctions is well known to those practiced in the art.

According to a presently preferred embodiment of the present invention, floating gate 22 fully overlies channel 18 as well as slightly overlapping source region 14 and drain region 16. This orientation is guaranteed by the self-aligning silicon MOS process typically used in the fabrication of MOS devices. According to a presently preferred embodiment of the present invention, floating gate 22 overlaps at least a portion of tunneling implant region 38.

The analog memory cell according to the present invention provides a 4-terminal single transistor device. In operation, the source 14 may be connected to ground along with the substrate 12. The drain 16 is then used to control hot-electron injection to floating gate 22. When both drain 16 and floating gate 22 are at a potential more than about +2.5 volts relative to ground, injection occurs and electrons will build up on floating gate 22, decreasing its voltage relative to ground. When it is desired to stop the process, dropping the potential on drain 16 to a value below about +2.5 volts relative to ground will effectively stop the hot-electron injection and the voltage on floating gate 22 will remain essentially constant.

With a gate oxide thickness of about 400Å, Fowler-Nordheim tunneling will begin when there is a potential difference of more than about 25 volts between the floating gate 22 and the plug region 40. There are at least two ways to control the tunneling mechanism. A first method is to temporarily apply a voltage of about +35 volts to plug region 40. This will yield a voltage difference of about +30 volts between floating gate 22 and plug region 40, promoting tunneling which will rapidly remove electrons from floating gate 22—raising its voltage. Alternatively, a fixed voltage of about +30 volts may be left on plug region 40; thus, in normal operation with, say +5 volts on control gate 26 and +5 volts on floating gate 22, there will be an insufficient voltage drop from plug region 40 to floating gate 22 to promote measurable tunneling, however, dropping the voltage on control gate 26 to zero (or some relatively low value) will consequently drop the voltage on floating gate 22, resulting in a larger voltage drop between plug region 40 and floating gate 22, exponentially increasing the tunneling rate and rapidly removing electrons from floating gate 22. This second implementation provides the advantage that the relatively high voltage +30 volt signal need not be carried on anything other than the metal contact lines 42 and need not be switched by the silicon integrated circuit device.

Typical voltages used to control the four-terminal embodiment of the device are as follows:

A first positive potential is applied to the drain region 16 with respect to the p– substrate to reverse bias the drain region 16 with respect to the p– substrate. The first positive potential has a magnitude of greater than about +2.5 volts relative to the substrate, but less than the voltage required to induce avalanche breakdown in the junction formed between the drain 16 and the substrate 12;

A second positive potential is capacitively coupled to the floating gate 22. The second positive potential has a magnitude of greater than about +2.5 volts relative to the substrate;

A third potential is applied to the source region 14 with respect to the substrate. The third potential is in the range of about zero to about +2.0 volts relative to the substrate; and A fourth potential is selectively applied to the tunneling junction (contact 42 in the first embodiment described above). The fourth potential is positive with respect to the floating gate 22 and it is selected to be high enough to induce the desired tunneling within a desired amount of time. In the embodiment described above, the fourth potential may be approximately +35 volts relative to the substrate.

Figure 3C:
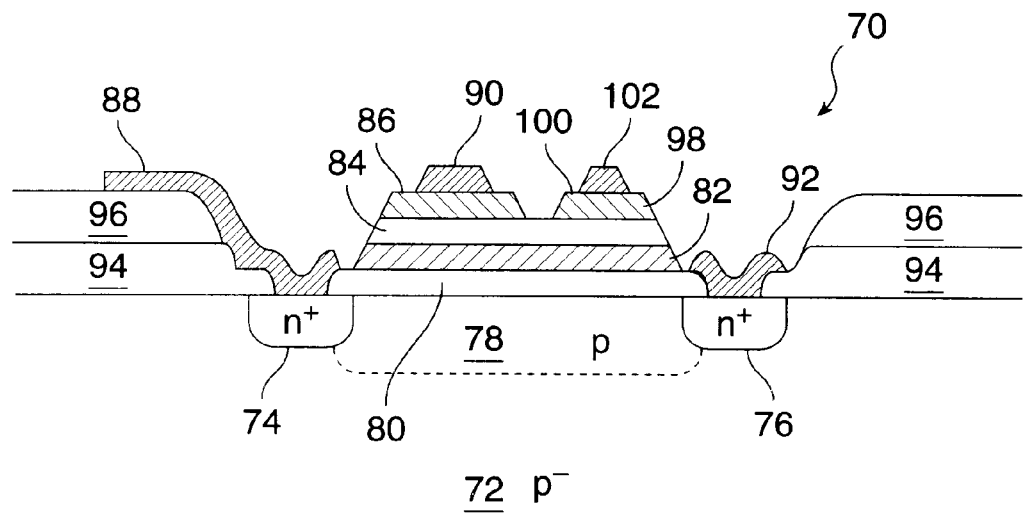
FIG. 3C is a cross-sectional diagram of an analog memory cell according to the present invention, in the alternative four-terminal embodiment, taken along line 3C—3C of FIG. 3D.
Figure 3D:
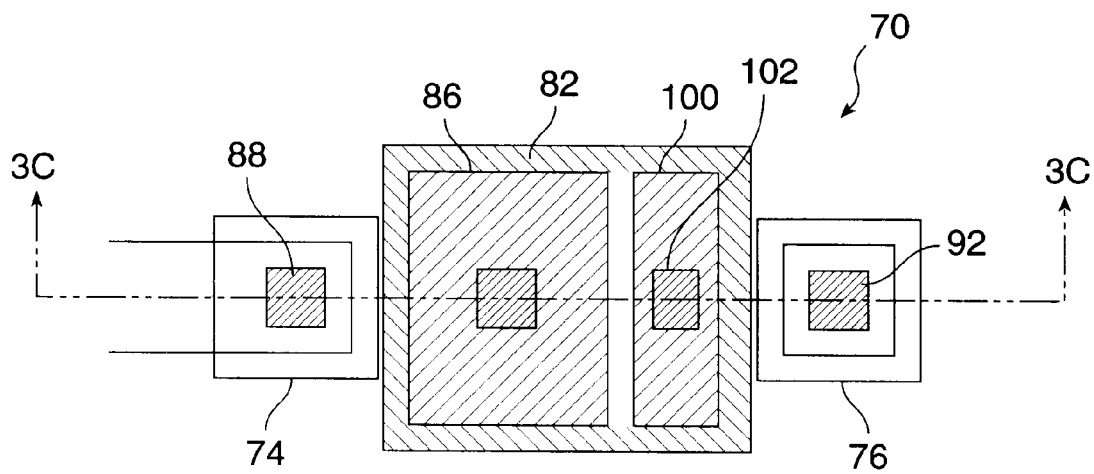
FIG. 3D is a top view of an analog memory cell according to the present invention, in the alternative four-terminal embodiment.

An alternative embodiment of the four-terminal embodiment of the present invention is shown in FIGS. 3C and 3D. FIG. 3D is a top view of an alternative embodiment of the four-terminal embodiment of the single transistor analog memory cell and FIG. 3C is a cross-sectional view taken along line 3C—3C of FIG. 3D.

Turning to FIG. 3C, the alternative four-terminal embodiment of the single transistor analog memory cell 70 is fabricated much the same as the four-terminal embodiment of the single transistor analog memory cell 10, on a p– type region of semiconductor substrate 72. The floating gate transistor portion of the alternative four-terminal embodiment of the single transistor analog memory cell 70 comprises n+ doped source implant region 74 within p-region 72, n+ doped drain implant region 76 within p– region 72, moderately doped p channel implant region 78, a gate oxide layer 80, a floating gate 82, an inter-poly oxide layer 84, a control gate 86, a source contact 88, a gate contact 90, and a drain contact 92. The p– substrate 72 is preferably doped to an impurity concentration of from about $3E14/cm^3$ to about $4E14/cm^3$. The n+ doped source implant region 74 and n+ doped drain implant region 76 are preferably doped to a level of between about $1E19/cm^3$ and about $1E20/cm^3$ with $1E20/cm^3$ presently preferred. The p channel implant region 78 is preferably doped to a moderate level using an implant such as p-base, the p type implant commonly used for the base region of a vertical bipolar transistor, with an impurity concentration in the channel of from about $1E17/cm^3$ to about $2E17/cm^3$ with $1E17/cm^3$ presently preferred. The voltage parameters set forth in the FIG. 3A embodiment are the same here.

Gate oxide layer 80 is preferably thermally grown silicon dioxide of thickness preferably equal to or less than about 400Å. Floating gate 82 is preferably fabricated of a heavily doped conductive polysilicon, however another conductor could also be used as would be apparent to those of ordinary skill in the art. Inter-poly oxide layer 84 is preferably equal to or less than about 750Å and may be deposited in any convenient manner. Control gate 86 is preferably fabricated of a heavily doped conductive polysilicon, however another conductor could also be used as would be apparent to those of ordinary skill in the art. Contacts 88, 90 and 92 are preferably metal such as aluminum or another suitable conductor. The floating gate 82 transistor portion of single transistor analog memory cell 70 is surrounded by a layer of field oxide 94 and a layer of a deposited oxide 96.

In typical use, transistor 70 has its source 74 tied to ground and its drain 76 tied to a potential which may be varied between a potential above about 2.5 volts and a potential below about 2.5 volts. The substrate 72 is at ground. A voltage applied to control gate 86 with respect to ground causes an intermediate voltage on floating gate 82.

The second portion of the alternative four-terminal embodiment of the single transistor analog memory cell 70 comprises a tunneling junction 98 adapted to allow removal of electrons from floating gate 82. Pursuant to this alternative embodiment, at some sacrifice in performance, a significant reduction in size is achieved by replacing tunneling implant region 38 from the FIG. 3A embodiment with a tunneling junction located between the first and second poly layers and comprising floating gate 82, interpoly oxide layer 84 (which may be any suitable depositable insulator), second poly layer 100 (separate from but preferably of the same material (preferably polysilicon) as control gate 86), and second poly contact 102 which is preferably the same as contact 90.

Tunneling junction 98 operates in a similar fashion to the tunneling junction described in the previously described embodiment 10, except that the high voltage is not applied to a separate implant within substrate 12. When contact 102 is brought to a relatively high positive voltage potential, electrons on floating gate 82 will tend to tunnel across interpoly oxide layer 84 to second poly layer 100 and then are conducted to second poly contact 102. The tunneling takes place across deposited oxide layer 84 rather than across a gate oxide and, accordingly, may result in a device exhibiting poorer performance than where a purer gate oxide is utilized. However, extra care may be used in the formation of the deposited oxide, or, the device may be suitable without such modification for many applications not requiring the ultimate in performance provided by use of a gate oxide in the tunneling junction.

Typical voltages used to control the alternative four-terminal embodiment of the single transistor analog memory cell 70 are as follows:

A first positive potential is applied to the drain region 76 with respect to the p– substrate to reverse bias the drain region 76 with respect to the p– substrate. The first positive potential has a magnitude of greater than about +2.5 volts relative to the substrate, but less than the voltage required to induce avalanche breakdown in the junction formed between the drain 76 and the substrate 72;

A second positive potential is capacitively coupled to the floating gate 82. The second positive potential has a magnitude of greater than about +2.5 volts relative to the substrate;

A third potential is applied to the source region 74 with respect to the substrate. The third potential is in the range of about zero to about +2.0 volts relative to the substrate; and A fourth potential is selectively applied to the tunneling junction (contact 102 in the second embodiment described above). The fourth potential is positive with respect to the floating gate 82 and it is selected to be high enough to induce the desired tunneling within a desired amount of time. In the embodiment described above, the fourth potential may be approximately +20 volts relative to the substrate.

The Three-terminal Embodiment

Figure 6A:
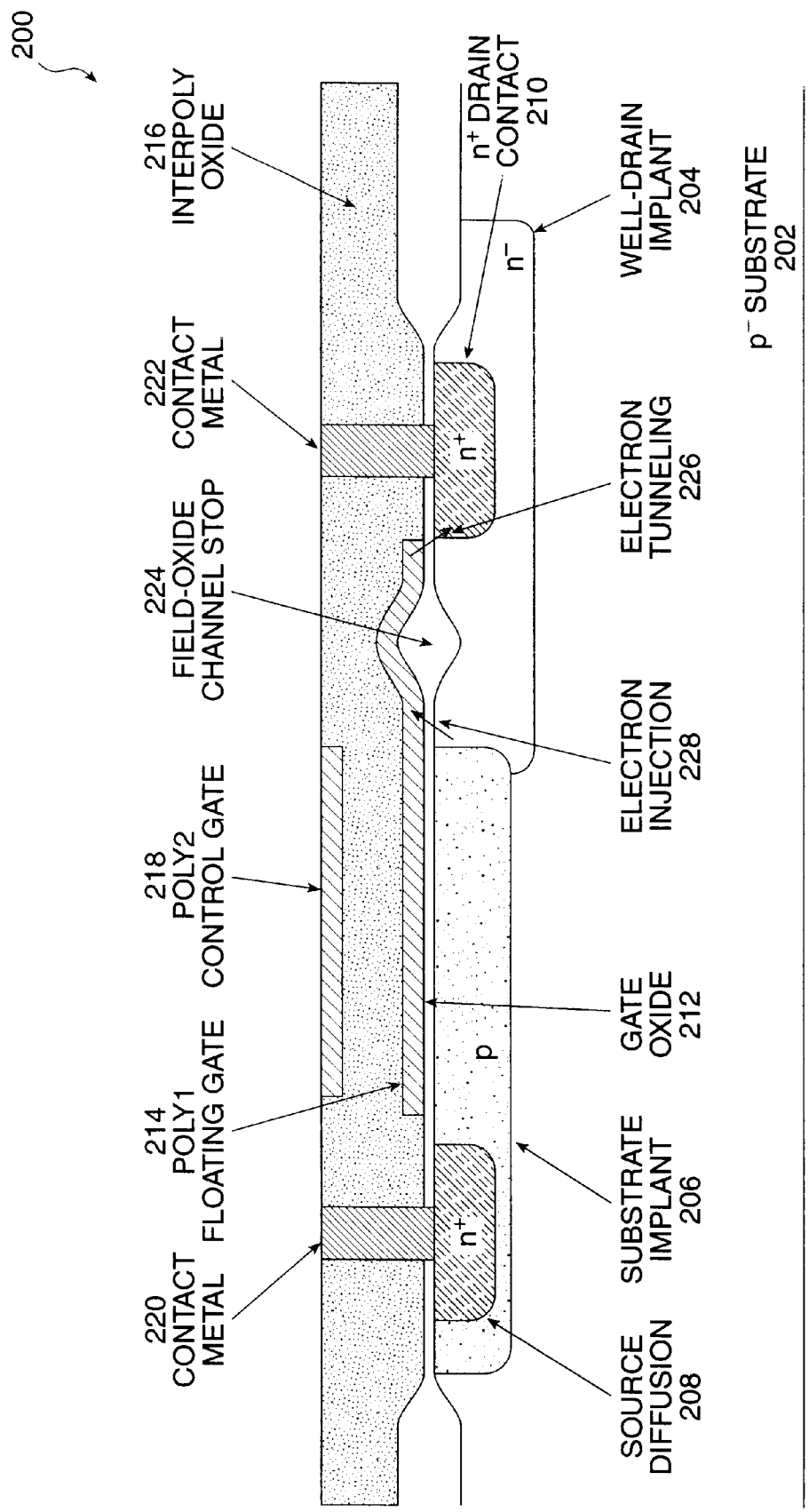
FIG. 6A is a cross-sectional diagram of an analog memory cell according to the present invention in a three-terminal embodiment.
Figure 6B:
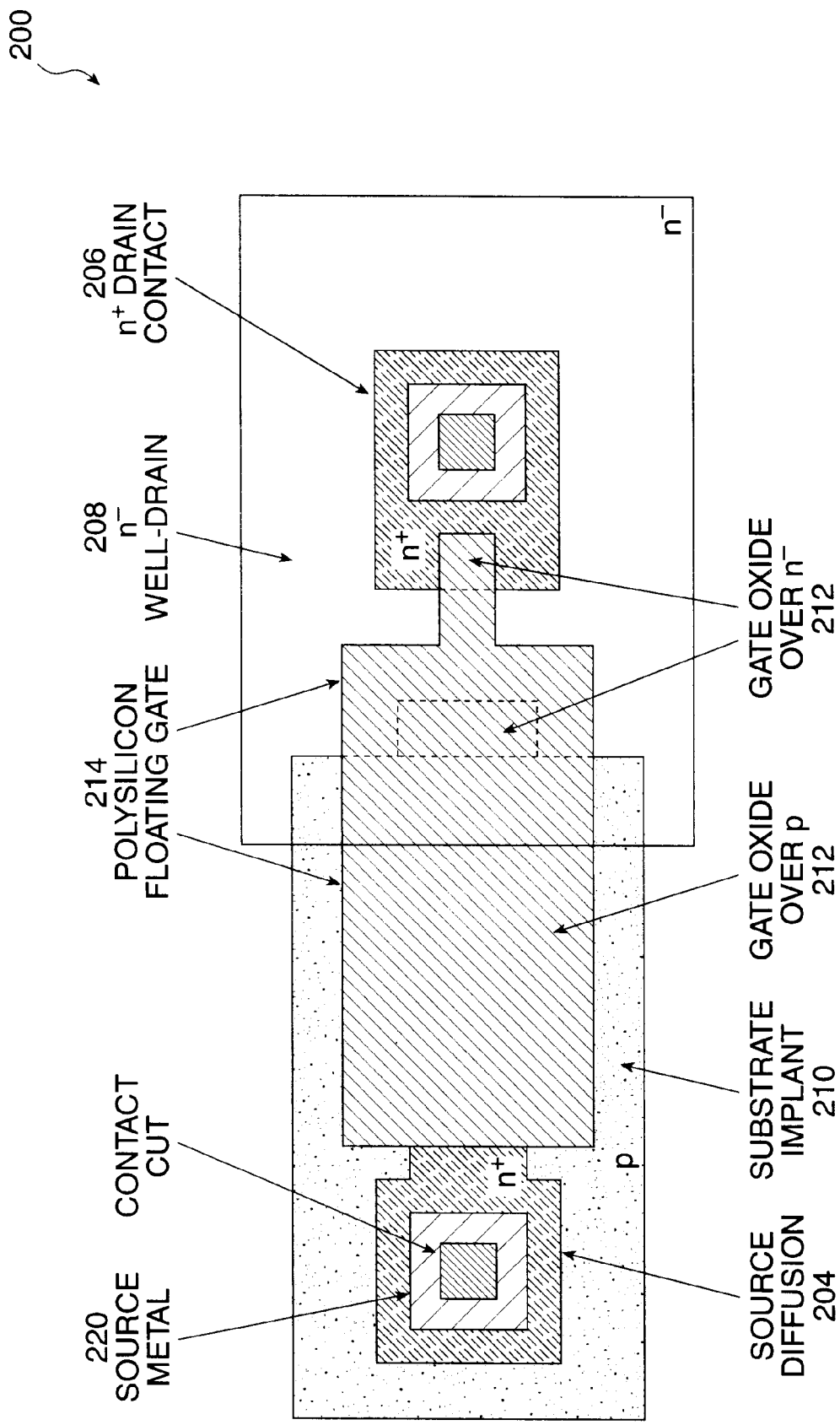
FIG. 6B is a top view of an analog memory cell according to the present invention in a three-terminal embodiment.

The three-terminal embodiment of the present invention, illustrated in FIGS. 6A and 6B, is a silicon MOS structure for long term learning. Like the previously disclosed embodiment, it has been fabricated in an n-well, double poly, 2 μm silicon gate BiCMOS process, although another compatible process could be used as would be known to those of ordinary skill in the art.

FIG. 6B is a top view of the single transistor analog memory cell and FIG. 6A is a cross sectional view.

Turning to FIG. 6A, the single transistor analog memory cell 200 is shown fabricated on a p– type region of semiconductor substrate 202, much the same as the four-terminal embodiment of the single transistor analog memory cell 10. The single transistor analog memory cell 200 comprises a lightly doped n– well-drain implant region 204 within p– region 202, moderately doped p channel implant region 206 within p– region 202, n+ doped source implant region 208 within p channel implant region 206, n+ doped drain implant region 210 within lightly doped n– well-drain implant region 204, a gate oxide layer 212, a floating gate 214, an inter-poly oxide region 216, a control gate 218, a source contact 220, a drain contact 222, and a field-oxide channel stop region 224. The p– substrate 202 is preferably doped to an impurity concentration of from about $3E14/cm^3$ to about $4E14/cm^3$.

The n+ doped source implant region 208 and n+ doped drain implant region 210 are preferably doped to a level of between about $1E19/cm^3$ and about $1E20/cm^3$, with $1E19/cm^3$ presently preferred. Locating the n+ doped drain implant region 210 within the n– well drain implant 204 performs two functions. First, it allows drain contact 222, preferably fabricated of metal or another suitable electrical conductor, to form an electrical connection to n– well-drain implant region 204. Second, it provides a source for tunneling electrons. Floating gate 214 extends adjacent to and, as a consequence of n+impurity diffusion during the fabrication process, slightly over n+ doped drain implant region 210. Floating gate 214 is separated from n+ doped drain implant region 210 by a region of gate oxide 212, forming tunneling junction 226.

Electron tunneling from floating gate 214, through gate oxide layer 212, to n+ doped drain implant region 210, is greatly facilitated as compared with tunneling from floating gate 214, through gate oxide 212, to n– well-drain implant region 204 for two reasons. First, the floating gate 214 cannot deplete the n+ doped drain implant region 210, whereas it does deplete the n– well. Thus, the oxide E-field is higher over the n+ doped drain implant region 210. Second, enhancement at the edge of floating gate 214 further augments the oxide field.

In order to remove electrons from floating gate 214, a sufficiently high voltage, e.g., +30 volts relative to ground for a 350 Å gate oxide is applied to n+ doped drain implant region 210 via drain contact 222. The large positive voltage creates a favorable environment for electron tunneling from the relatively negative floating gate 214 to n+ doped drain implant region 210, removing electrons from floating gate 214.

The n– well-drain implant 204 is preferably lightly doped to an impurity concentration of from about $1E15/cm^3$ to about $1E16/cm^3$, with $5E15/cm^3$ presently preferred. The purpose of lightly doped n– well-drain implant 204 is to permit application of a high voltage to n+ doped drain implant region 210 and modify the electron injection process.

Figure 7:
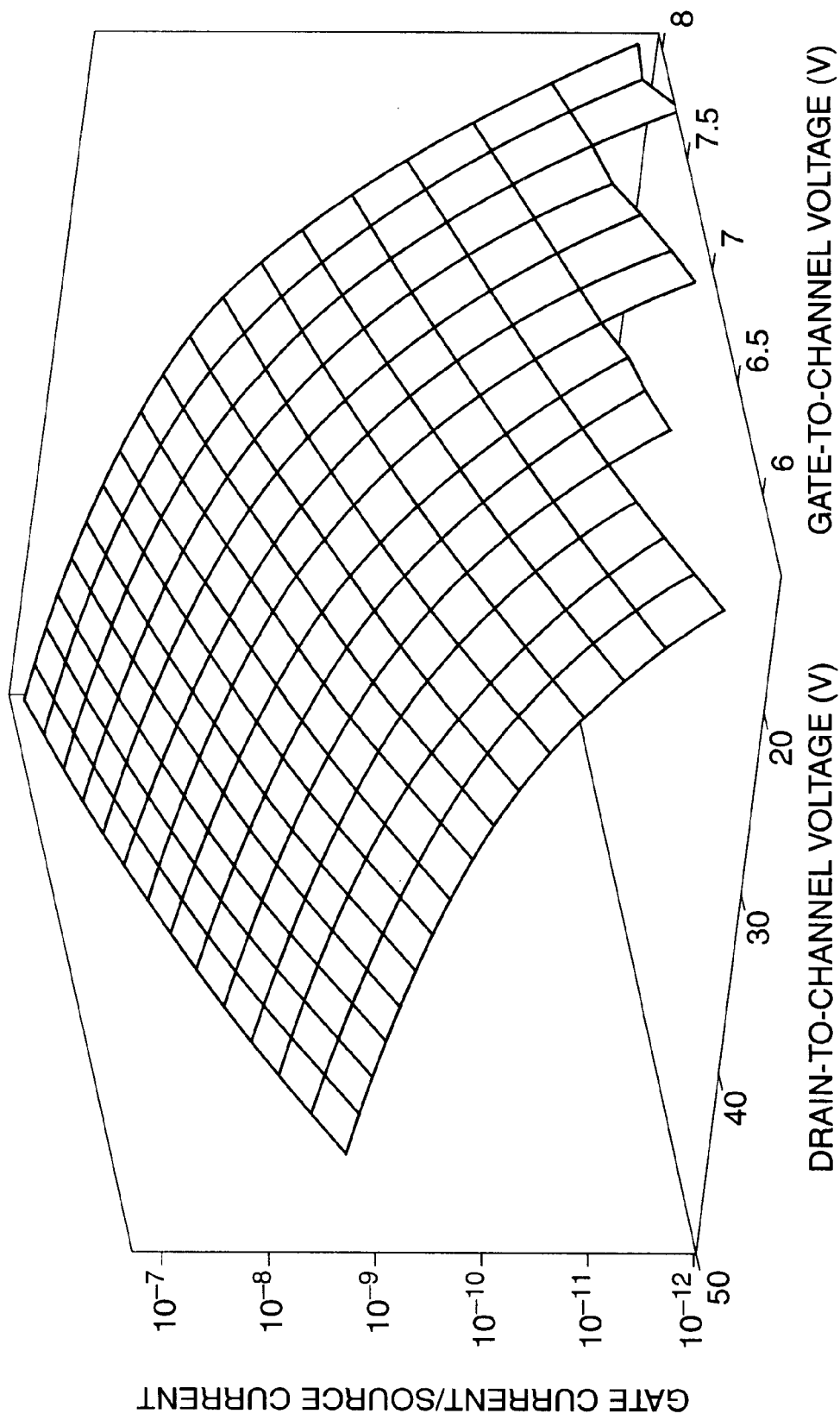
FIG. 7 is a plot of channel hot-electron efficiency versus drain-to-channel and gate-to-channel voltages according to the present invention in a three-terminal embodiment.

According to a presently preferred embodiment of the three terminal embodiment, floating gate 214 overlaps at least a portion of n– well-drain implant 204, and also slightly overlaps overlapping n+ doped source implant region 208 and n+ doped drain implant region 210. As in the four-terminal embodiment of the present invention, this orientation is guaranteed by the self-aligning silicon MOS process typically used in the fabrication of MOS devices. The p channel implant region 206 is preferably doped to a moderate level using an implant such as the p type implant commonly used for the base region of a vertical bipolar transistor, with an impurity concentration in the channel of from about $1E17/cm^3$ to about $2E17/cm^3$ with $1E17/cm^3$ presently preferred. This implant significantly improves the efficiency of the electron injection process by modifying the drain-to-channel depletion layer profile to that approximating a one-sided step junction and raising the transistor threshold voltage, favoring the collection of electrons by the floating gate 214. This transistor has a 6.2 volt threshold, allowing subthreshold channel currents at gate voltages high enough (e.g., +5 volts) to collect injected electrons. As previously discussed, and as indicated by the energy band diagram of FIG. 2D, the probability of injecting electrons onto the gate is greatly increased. The three-terminal embodiment synapse transistor injection efficiency versus drain-to-channel and gate-to-channel voltages is shown in FIG. 7.

Gate oxide layer 212 is thermally grown silicon dioxide of thickness preferably equal to or less than about 350 Å. Floating gate 214 is preferably fabricated of a heavily doped conductive polysilicon, however another conductor could also be used as would be apparent to those of ordinary skill in the art. Inter-poly oxide region 216 is preferably equal to or less than about 750 Å in the area between the control gate 218 and the floating gate 214 and may be deposited in any convenient manner. Control gate 218 is preferably fabricated of a heavily doped conductive polysilicon, however another conductor could also be used as would be apparent to those of ordinary skill in the art. Contacts 220 and 222 are preferably metal such as aluminum or another suitable conductor. The field-oxide channel stop 224 is used to isolate the n+ doped drain implant region 210 from the p channel implant region 204. The field oxide channel stop 224 is preferably thermally grown field oxide, although another suitable insulating material could also be used as would be apparent to those of ordinary skill in the art.

The analog memory cell 200 according to the present invention is a 3-terminal single transistor device. In typical use, analog memory cell 200 has its source contact 220 and p– type region of semiconductor substrate 202 tied to ground. The drain contact 222 is then used to control hot-electron injection to floating gate 214 and electron tunneling from floating gate 214. As discussed above, to be injected into the floating gate 214, the channel electrons must (1) acquire the 3.2 eV required to surmount the oxide barrier, (2) scatter upwards into the gate oxide, and (3) be transported across the oxide to the floating gate 214. The synapse transistor's injection efficiency is much improved over conventional MOSFET devices for two reasons.

First, the synapse transistor's channel-to-drain depletion region is one-sided, with 95% of the space-charge layer on the drain 210 side of the junction. When $V_{dc}$=30V, peak field occurs a mere 0.14 μm into this space-charge layer. At peak field, the conduction-band potential rises 3.2V in 25λ (where λ=7 nm is the electron mean-free-path length). A hot-electron potential is therefore available near the channel edge of the space-charge layer. By contrast, in the conventionally doped well-drain transistor, peak field is not reached until 2 μm into the space-charge layer.

Second, the higher surface-acceptor concentration raises the synapse transistor's threshold voltage $V_t$ from 0.8 V to 6.2 V. It is evident from FIGS. 2B and 2D that electron transport within the oxide layer depends upon the direction of the oxide E-field. Where the gate voltage exceeds the surface potential, the oxide sweeps injected electrons across the gate oxide into the floating gate 214. Where the surface potential exceeds the gate voltage, injected electrons tend to return to the silicon surface. When $V_{dc}$=30V, the synapse's conduction-band potential is 3.2V at z=0.22 μm, whereas the surface potential does not exceed the gate voltage until z=0.37 μm. The gate current arises primarily in the intervening region (0.22<z<0.37 μm)). By contrast, in the conventional well-drain transistor with $V_{dc}$=30V, the conduction-band potential does not reach 3.2V until 0.9 μm into the space-charge layer; here, the surface potential exceeds the gate voltage by 6.5V, preventing a gate current.

With a gate oxide thickness of about 350 Å, Fowler-Nordheim tunneling will begin when there is a potential difference of more than about 25 volts between the floating gate 214 and the n+ doped drain implant region 210.

Thus, the transistor exhibits four operating regimes. (1) When the drain-to-channel potential ($V_{dc}$) is less than about 10 volts, the tunneling and injection currents are both exceedingly small; the charge on the floating gate 214 is retained in a nonvolatile state. (2) When the drain-to-channel potential ($V_{dc}$) is greater than about 10 volts but less than about 30 volts, the tunneling current is small, but the injection current is not small; electrons are added to the floating gate 214, increasing the threshold voltage. (3) When the drain-to-channel potential ($V_{dc}$) is greater than about 30 volts but less than about 40 volts, neither the tunnelling nor the injection current is small; the floating gate 214 asymptotes to a voltage where the gate current is zero. (4) When the drain-to-channel potential ($V_{dc}$) is greater than about 40 volts, the tunneling current is larger than the injection current; electrons are removed from the floating gate 214, decreasing the threshold voltage. The complete transistor gate-current is represented by the following equation, Eqn. (1):

$$I_g = \xi(V_{dg} + V_{bi})^2 e^{-\frac{V_0}{V_{dg}+V_{bi}}} - \eta I_s e^{-\frac{V_\alpha}{V_{ge}} - \left(\frac{V_\beta}{V_{dc}+V_\eta}\right)^2} \quad (1)$$

Where $V_{dg}$ is the drain-to-gate potential, ξ, $V_{bi}$, $V_o$, η, $v_\eta$, $V_\beta$ and $V_\alpha$ are constants, $I_g$ is the gate current, $I_s$ is the source current, $V_{gc}$ is the gate-to-channel potential, and $V_{dc}$ is the drain-to-channel potential.

Typical voltages used to control the three-terminal embodiment of the single transistor analog memory cell 200 are as follows:

A first potential is selectively applied to the drain region 210 with respect to the p– substrate to reverse bias the drain region 210 with respect to the p– substrate and to induce the desired tunneling or injection within a desired amount of time. The first potential has a range of from about zero volts to the voltage required to induce avalanche breakdown in a junction formed between said n+ type region and a transient parasitic p-type channel formed in said n– region at certain positive voltages. In the three-terminal embodiment described above, the first potential may be as much as approximately +45 volts relative to the p– substrate 202.

A second positive potential is capacitively coupled to the floating gate 214. The second positive potential has a magnitude of greater than about +2.5 volts relative to the p– substrate 202. As will be apparent to those of ordinary skill in the art, higher voltages on the floating gate 214 may be beneficial; however, higher floating gate 214 voltages will require corresponding increases in drain region 210 voltages to actuate electron tunneling and injection. At present, a preferred magnitude of floating gate 214 voltage is about 6.0 volts.

A third potential is applied to the source region 208 with respect to the p– substrate 202. The source region 208 potential is used to control the MOS transistor behavior. As will be apparent to one of ordinary skill in the art, the source 208 potential is therefore limited only by the desired application of the invention.

The stored memory value is represented by the floating gate 214 charge. Either channel current or channel conductance can be selected as the synapse output. Inputs are typically applied to the control gate 218, which capacitively couples to the floating gate 214. From the control gate's 218 perspective, altering the floating gate 214 charge shifts the transistor's threshold voltage $V_t$. Electron injection adds electrons to the floating gate 214, reducing the charge and raising the threshold; tunneling removes electrons, increasing the charge and reducing the threshold.

The synapse is typically operated in its subthreshold regime, to limit the power consumption, and either drain 210 current or source 208 current is typically selected to be the synapse output. When operated in this fashion, the synapse output is the product of a stored memory value and the applied input as follows:

$$I_S = I_O e^{\frac{\kappa Q_{fg}}{C_T U_t}} e^{\frac{kC_{in}V_{in}}{C_T U_t}} = I_O e^{\frac{\kappa Q_{fg}}{C_T U_t}} e^{\frac{\kappa' V_{in}}{U_t}} \quad (2)$$

$$= I_m e^{\frac{\kappa' V_{in}}{U_t}} \quad (3)$$

where $I_s$ is the source current, $I_o$ is the pre-exponential current, κ is the floating gate 214 to channel-surface coupling coefficient, $Q_{fg}$ is the floating gate 214 charge, $C_t$ is the total capacitance seen by the floating gate 214, $U_t$ is the thermal voltage κT/q, $C_{in}$ is the input coupling capacitance, $V_{in}$ is the signal voltage applied to the control gate 218, $Q_t$ is defined as $C_t U_t$, and κ' is defined as $\kappa C_{in}/C_t$.

The current $I_m$ is a learned quantity; its value changes with synapse use. The synapse output is the product of $I_m$ and the exponentiated gate input. Because the electron injection and tunneling gate currents vary with the synapse terminal voltages and channel current, $I_m$ varies with the terminal voltages, which are imposed on the device, and with the channel current, which is the synapse output. Consequently, the synapse exhibits a type of learning by which its future output depends on both the applied input and the present input.

Figure 5:
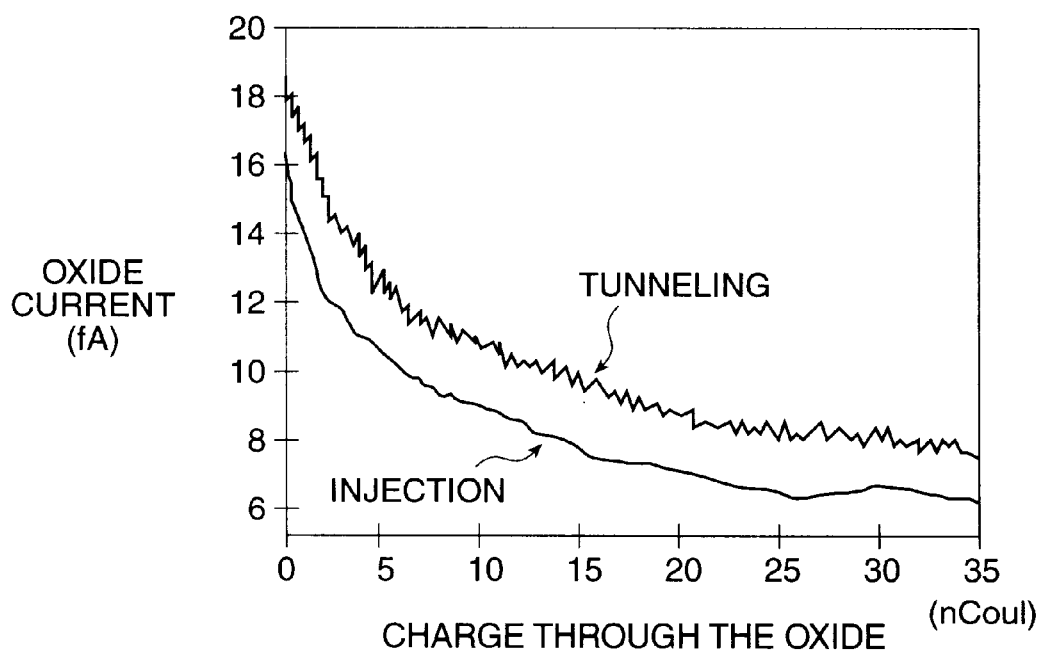
FIG. 5 is a plot of tunneling and injection rates versus total charge transfer through the oxide for an analog memory cell according to the present invention in a four-terminal embodiment, where the tunneling junction $V_{ox}$=29.5 volts, and the injection transistor $V_{drain}$=3.25 volts and $V_{gate}$=5.5 volts.

Both the three- and four-terminal embodiments of the present invention describe a floating gate transistor where the quantity of charge stored on floating gate 22, 214 is modified by tunneling or injecting electrons through gate insulator 20, 212. It is well known to those practiced in the art that high-energy electron transport through an oxide insulator leads to the formation of oxide dislocations, known as traps, which act to impede further electron transport. It is also well known that oxide purity greatly affects the trap formation rate; in the chosen vendor's fabrication process, a deposited oxide, such as inter-poly oxide 24, 216, tends to "trap up" at a much faster rate than does the ultra-pure gate oxide 20, 212. Therefore, although the present implementation of the invention tunnels through gate oxide 20, 212 at tunneling junction 44, 226, rather than through inter-poly oxide 24, 216 or through some other oxide, operation of the present invention is independent of the choice of oxide region for tunneling, with the preferred embodiment of the present invention merely indicating that gate oxide 20, 212 is the purest available oxide in the chosen vendor's fabrication process. The electron transport rate versus total oxide charge for the four-terminal embodiment of the preferred embodiment of the present invention is shown in FIG. 5.

Both the three- and four-terminal embodiments of the present invention use the selective application of varying positive voltages to operate the electron injection and electron tunneling to vary the stored charge on the floating gate 22, 214. The embodiments above describe positive voltages as high as 45 volts. The 45 volt requirement is a consequence of the 350–400 Å gate oxides 20, 212 found in the chosen vendor's 2 μm process, rather than an inherent limitation in the synapse itself. As would be clear to one of ordinary skill in the art, the use of more modern processes, resulting in far thinner gate oxide layers 20, 212, would significantly reduce the required voltages. In addition, one of ordinary skill in the art would note that at the lower voltages, the n– well-drain structure used to prevent pn-junction breakdown could be replaced with a graded junction, reducing the synapse size.

Both the three- and four-terminal embodiments of the present invention have great potential for integrated circuit applications which require storing an analog voltage, learning signal correlations, or adapting to circuit and signal conditions. Two examples of such applications are discussed herein. These examples are intended merely to illustrate usage of the device, and not in any way to limit its many potential applications.

Analog Memory Cell

The first example is an analog memory cell. In the past, achieving high resolution nonvolatile analog parameter storage has been hampered by the lack of a suitable storage element. Typical implementations store an m-bit digital word in m binary value memory cells, where m usually ranges from 8 to 16, and generate an analog output using a digital-to-analog converter (DAC). This approach typically requires between 25 and 200 transistors. Achieving equivalent resolution in a compact analog memory cell requires nonvolatile storage, a mechanism for analog readout, and careful control of the memory writing process.

Both the three- and four-terminal embodiments of the present invention readily support all the requirements for an analog memory cell. Nonvolatile storage is achieved by storing charge on the fully insulated gate of a floating gate transistor. Analog readout, in this example, is achieved by measuring the analog-valued floating gate voltage. To those practiced in the art, careful control of the write process typically implies using a feedback loop to control the memory writing. Since the present invention supports simultaneous memory reading and writing, it allows such closed loop control of the write process.

Figure 8:
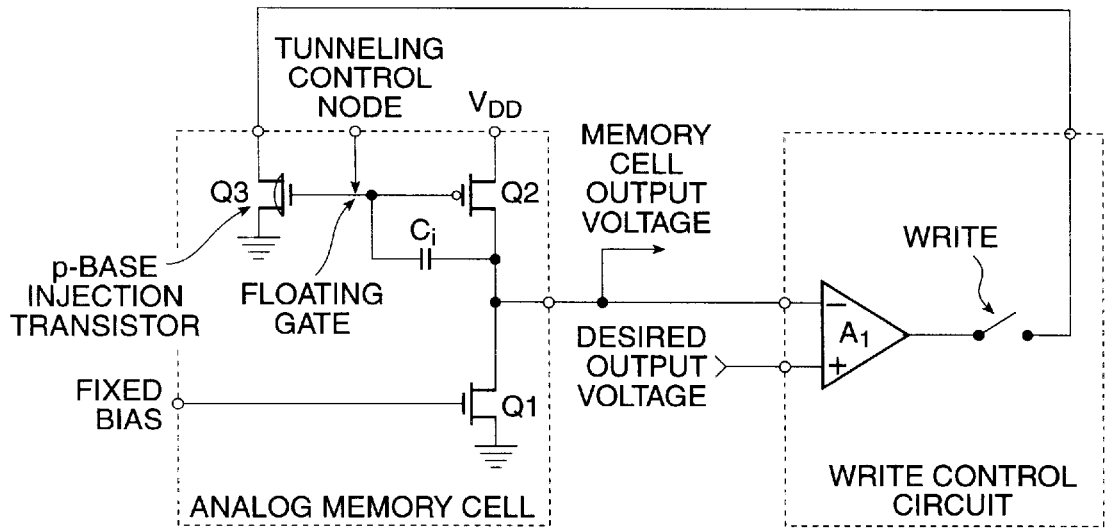
FIG. 8 is a diagram of a buffered voltage-output analog memory incorporating the present invention in a four-terminal embodiment, together with exemplary control circuitry.

FIG. 8 shows the example analog memory cell for the four-terminal embodiment of the present invention, together with a feedback control loop for memory writing. Transistor Q1 is used for biasing. The inverting amplifier formed by Q1 and Q2 drives the output node. Using subthreshold channel currents in this amplifier permits rail-to-rail output voltages and a power consumption measured in nW. Q3 is the four-terminal embodiment of the present invention, and capacitor $C_i$ represents the four-terminal embodiment of the present invention's floating gate 22, preferably enlarged as increased capacitance enhances memory resolution.

An analog memory cell fabricated as in FIG. 8 and operated as discussed herein has demonstrated analog parameter storage with 15 bits effective resolution.

Feedback Controlled Write Mechanism

The feedback controlled write mechanism is preferably operated as follows:

1. The cell is erased before writing. A positive high voltage applied to the tunneling control node ($V_{tun}$) removes electrons from the floating gate 22, causing the memory cell output voltage ($V_{out}$) to approach ground. $V_{tun}$ is then brought low, disabling the tunneling.

2. The desired output voltage ($V_{in}$) is applied to the non-inverting input of comparator $A_1$. Enabling the comparator output sets the drain of injection transistor Q3 high, causing electrons to be injected onto the floating gate 22. Electron injection causes $V_{out}$ to slew upwards, at a rate set approximately by Eqn. (4):

$$\frac{\delta V_{out}}{\delta t} = \frac{I_{inj}}{C_i} \qquad (4)$$

3. Once $V_{out}$ exceeds $V_{in}$, the comparator $A_1$ lowers Q3's drain voltage to ground, leaving $V_{out}=V_{in}$. Disabling the comparator output preserves $V_{out}$ at the desired value.

A Four-Terminal Synaptic Array

The second example, a synaptic array, can use either the four-terminal or three-terminal embodiment of the present invention embodied as a single transistor silicon synapse. The implied analogy with biological synapses arises from the following shared attributes:

1) Long term nonvolatile analog memory storage;
2) Memory plasticity, where plasticity is defined as an ability to modify the stored memory with time;
3) Implicit computation of the feedforward product of an input with the stored memory;
4) Implicit updates of the stored memory according to a Hebbian learning rule; and
5) Minimum device size and minimum power consumption within the available fabrication medium (carbon-based biological substrate or silicon based VLSI circuit substrate).

Figure 9:
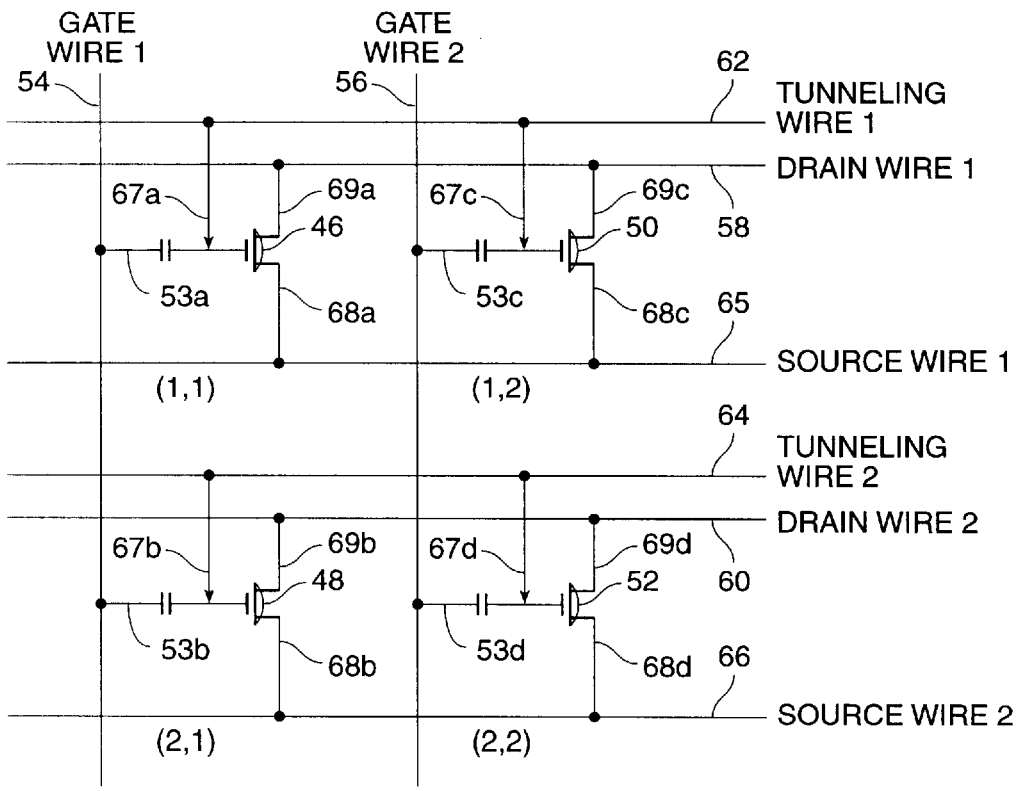
FIG. 9 is a diagram of an array-type analog memory system according to the present invention in a four-terminal embodiment.

FIG. 9 shows one of many possible array implementations using the four-terminal embodiment of the present invention; the four transistors 46 (1,1), 48 (2,1), 50 (1,2) and 52 (2,2) shown in FIG. 9 represent a small subset of a potentially much larger array structure. Each of these transistors is a silicon synapse, where synaptic strength (synaptic weight) is represented by charge stored on its floating gate 22. Each transistor has its floating gate 22 capacitively coupled to a gate wire (54, 56). These array inputs connect to the second-level polysilicon gates (53a, 53b, 53c, 53d) of the transistors, with each individual input shared among all the gates in a particular column of the array. The array outputs connect to the sources 14 and drains 16 of the synapse transistors, with each individual output shared among all the synapses in a particular row of the array by connection to source wires (65, 66) and drain wires (58, 60). The feedback error signals connect to the tunneling nodes (67a, 67b, 67c, 67d), source terminals (68a, 68b, 68c, 68d), and drain terminals (69a, 69b, 69c, 69d) of the synapse transistors, with each individual signal shared among all the device terminals in a particular row of the array.

Each synapse individually computes the sum of its column input signal and its stored weight value, generating as its output a channel conductance whose value is derived from the computation. This conductance is translated to a channel current by the imposition of a potential difference between the row drain and source terminals of said synapse. The sum of channel currents along a row is an array output. All synapses operate in parallel, performing their computations simultaneously in time.

Figure 10:
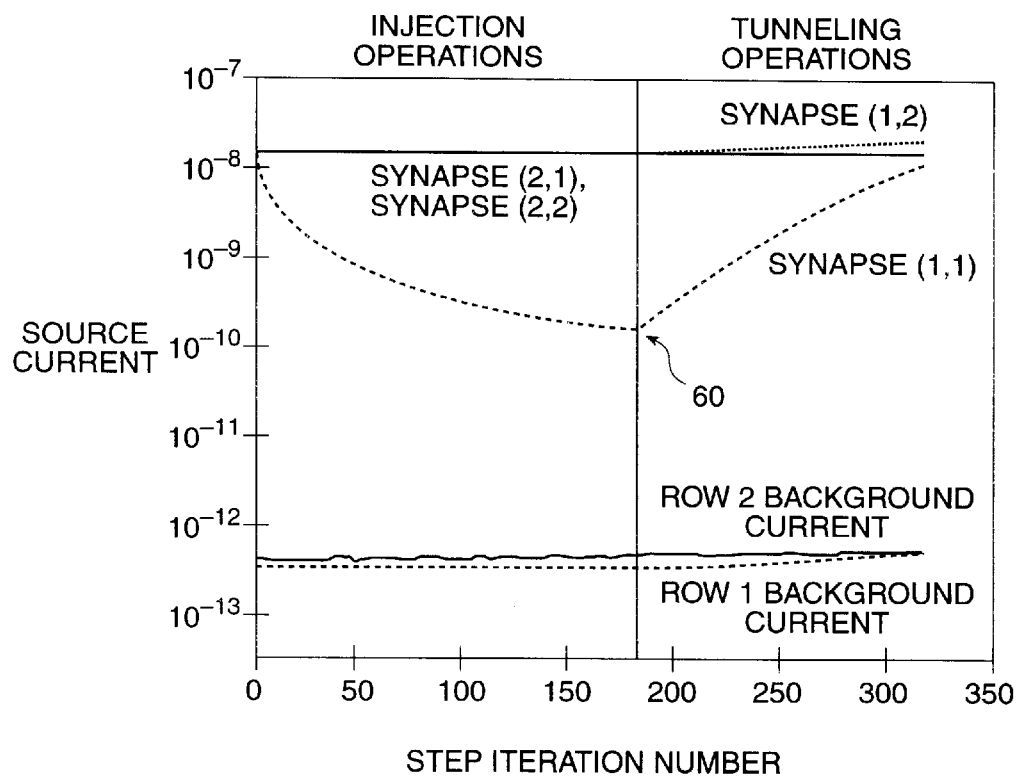
FIG. 10 is a plot of output currents from a 2×2 section of a synaptic array according to the present invention in a four-terminal embodiment, showing unlearning and learning at a single selected synapse.

Each synapse individually computes updates to its stored weight value. The tunneling current for each synapse derives from the potential difference between the row tunneling voltage and the synapse floating gate 22 voltage. The injection current for each synapse derives from the synapse drain 40 voltage and channel current. The sum of these two oxide currents determines the net change in floating gate 22 voltage. All synapses operate in parallel, computing their memory updates simultaneously in time. The particular learning algorithm employed by the array derives from the circuitry at the array boundaries; in particular, the circuitry connected to each of the tunneling nodes 42, source terminals 28, and drain terminals 32. FIG. 10 shows the output currents from a 2×2 section of the synapse array as shown in FIG. 9. Here 180 injection operations were followed by 160 tunneling operations. For the injection operations, the drain wire 1 (58) was pulsed from 2.0 V up to 3.3 V for 0.5 seconds with gate wire 1 (54) at 8 V and gate wire 2 (56) at 0 V. For the tunneling operations, tunneling wire 1 (62) was pulsed from 20 V up to 33.5 V with gate wire 2 (56) at 0 V and gate wire 1 (54) at 8 V. Because the measurements from the 2×2 section come from a larger array, the "background" current from all other synapses on the row is diagrammed as well. This background current is several orders of magnitude smaller than the selected synapse current, and therefore negligible. FIG. 10 shows an example of the nature of the weight update process. Source current is used as a measure of the synapse weight. The experiment starts with all four synapses set to the same source current. First, synapse 46 (1,1) is activated by raising the voltage on both column 54 and row 58. Synapse 46 experiences hot electron injection, which preferentially decreases its weight value. At position 60 in FIG. 10, synapse 46 is deactivated by decreasing the voltage on both column 54 and row 58. Also at position 60, synapse 50 is activated by raising the voltage on column 56, and tunneling is activated by raising the voltage on row 62. Synapse 46 (1,1) experiences electron tunneling, which preferentially increases its weight value. This experiment shows that synapse 46 can preferentially learn by raising the voltage on row 62 and decreasing the voltage on column 54, and can preferentially unlearn by raising the voltages on both column 54 and row 58.

A Three-Terminal Synaptic Array

Figure 11:
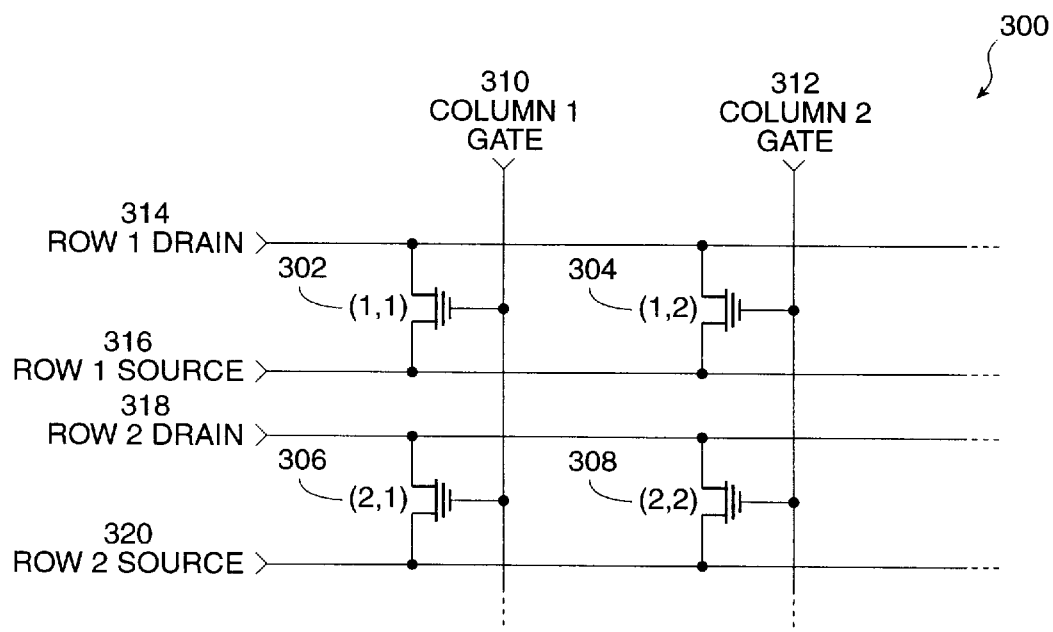
FIG. 11 is a diagram of an array-type analog memory system according to a preferred embodiment of the present invention in a three-terminal embodiment.

A possible synaptic array constructed with the three-terminal embodiment of the present invention at each node is shown in FIG. 11. The four transistors 302 (1,1), 306 (2,1), 304 (1,2) and 308 (2,2) shown in FIG. 11 represent a small subset of a potentially much larger array structure. Because a 2×2 array 300 uses the same row-column addressing employed by larger arrays, the synapse isolation can be characterized completely. Each of these transistors is a three-terminal embodiment of the silicon synapse, where synaptic strength (synaptic weight) is represented by charge stored on its floating gate 214. Each transistor has its floating gate 214 capacitively coupled to a gate wire (310, 312), its drain contact 222 connected to a drain wire (314, 318), and its source contact 220 connected to a source wire (316, 320).

From among the many possible ways of using the array 300, the source current was selected as the synapse output, and the synapses were turned off while tunneling. The voltages shown in TABLE 1 were applied to read, tunnel, or inject synapse {1,1} 302 selectively, while ideally leaving the other synapses (304, 306, 308) unchanged:

TABLE 1

|  | col 1 gate 310 | col 2 gate 312 | row 1 drain 314 | row 2 drain 318 | row 1 source 316 | row 2 source 320 |
| --- | --- | --- | --- | --- | --- | --- |
| read | +5 | 0 | +5 | 0 | 0 | 0 |
| tunnel | 0 | +4.5 | +35 | 0 | +2 | 0 |
| inject | +5 | 0 | +25 | 0 | 0 | 0 |

Figure 12:
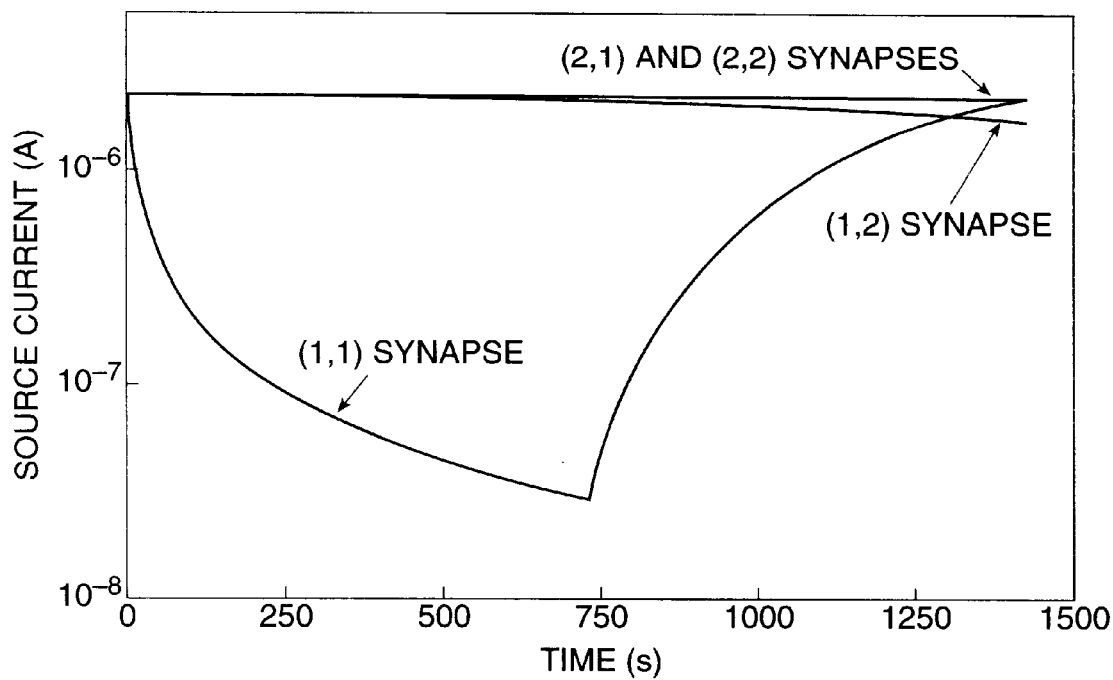
FIG. 12 is a plot of output currents from a 2×2 section of a synaptic array according to the present invention in a three-terminal embodiment, showing learning and unlearning at a single selected synapse where the {1,1} synapse is first injected down to 30 nA, then tunneled back up to 2 $\mu$A.

To obtain the data in FIG. 12, all synapses were initially set to $I_s$=2 uA. The {1,1} synapse 302 was injected down to 30 nA, and then tunneled back up to 2 uA, while the source currents of the other three synapses were measured. As expected, the row 2 synapses (306, 308) were unaffected by either the tunneling or the injection. The {1,2} synapse 304 was similarly unaffected by the injection, but during tunneling experienced both FOX injection and parasitic tunneling. A 4.5V gate signal was chosen to ensure FOX injection slightly exceeded parasitic tunneling at the {1,2} synapse 304.

Figure 13:
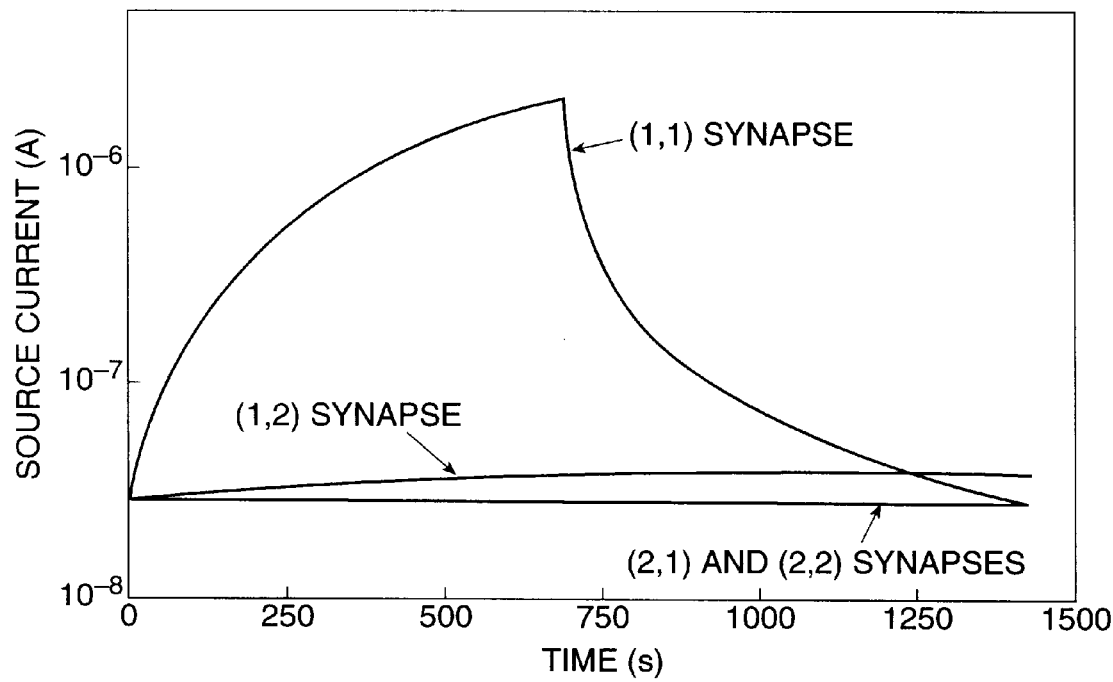
FIG. 13 is a plot of output currents from a 2×2 section of a synaptic array according to the present invention in a three-terminal embodiment, showing learning and unlearning at a single selected synapse where the {1,1} synapse is first tunneled up to 2 $\mu$A, then injected back down to 30 nA.

To obtain the data in FIG. 13, all four synapses were first set to $I_s$=30 nA. The {1,1} synapse 302 was tunneled up to 2 uA, and then injected back down to 30 nA. Like the experiment of FIG. 12, when the {1,1} synapse 302 tunneled, the {1,2} synapse 304 experienced both FOX injection and parasitic tunneling. With the chosen 4.5V gate signal, parasitic tunneling slightly exceeded FOX injection at the {1,2} synapse 304.

The measured crosstalk between row synapses was −0.5% during tunneling, and <<0.1% for all other operations. It is anticipated that, with an improved channel stop and thinner gate oxide, <0.1% crosstalk can be achieved for all operations.

It should be readily apparent to those practiced in the art that by placing appropriate circuitry at the ends of the row/column wires in either embodiment of the synaptic array structure, it is possible to implement a Hebbian learning rule in an array of single transistor synapses, a back-propagation of errors learning rule in an array of either four-terminal or three-terminal single transistor synapses, and many other similar neural network learning rules in an array of either four-terminal or three-terminal single transistor synapses. It will be further apparent that arrays such as that of FIG. 9 and FIG. 11 simultaneously perform analog computation and learning for all synapses in parallel, and as such can implement powerful computational and learning functions. It will be further apparent that the arrays shown in FIG. 9 and FIG. 11 are only two of many potential array embodiments, each with its own computational advantages, and the examples of FIG. 9 and FIG. 11 are not intended to limit in any way the potential applications of the present invention.

A Learning Rule for the Three-Terminal Embodiment

By repeatedly activating the learning functions of the present invention in the three-terminal embodiment for several tunneling and injection voltages, and equating a weight w with the source current $I_s$, a learning rule for the synapse in the three-terminal embodiment can be derived to fit the data.

To determine the electron injection portion of the learning rule equation, the synapse output is first noted as the product of a stored memory value and the applied input as follows:

$$I_S = I_o e^{\frac{\kappa Q_{fg}}{C_T U_t}} e^{\frac{\kappa C_{in} V_{in}}{C_T U_t}} = I_o e^{\frac{\kappa Q_{fg}}{C_T U_t}} e^{\frac{\kappa' V_{in}}{U_t}} \quad (5)$$

$$= I_m e^{\frac{\kappa' V_{in}}{U_t}} \quad (6)$$

By taking the temporal derivative of Eqn. (6), the following equation is generated:

$$\frac{\delta I_s}{\delta t} = \frac{\kappa}{Q_T} I_o e^{\frac{\kappa' V_{in}}{U_t}} e^{\frac{\kappa Q_{fg}}{Q_T}} \delta \frac{Q_{fg}}{\delta t} = \frac{\kappa}{Q_T} I_s I_g \quad (7)$$

As the gate current $I_g$ is proportional to the source current $I_s$, the proportionality factor is the electron injection efficiency, Eqn. (8).

$$I_g = \eta I_s e^{-\frac{V_\alpha}{V_{gc}} - \left(\frac{V_\beta}{V_{dc} + V_\eta}\right)^2} \quad (8)$$

A (−) sign is added to the gate current because electron injection decreases the synapse weight.

$$I_g = -\eta I_s e^{-\frac{V_\alpha}{V_{gc}} - \left(\frac{V_\beta}{V_{dc} + V_\eta}\right)^2} = -f(V_{dc}, V_{gc}) I_s \quad (9)$$

Equation (9) is substituted into Eqn. (8), replacing Is with w:

$$\frac{\delta w}{\delta t} = -\frac{\kappa f(V_{dc}, V_{gc})}{Q_T} w^2 \quad (10)$$

For fixed drain 210 and source 208 voltages, $V_{gc}$ increases with w, whereas $V_{de}$ decreases with w; f, which depends on both, typically increases with w. As a result, the subthreshold weight-decrement rate varies as $w^{(2+x)}$, where x represents a positive-valued correction term. However, the synapse is often operated near threshold, to increase the learning rate. For source currents near threshold, the $\delta I_s/\delta Q_{fg}$ slope declines relative to its subthreshold value. For 1 nA<w<1 μA, the decreasing $\delta I_s/\delta Q_{fg}$ slope counteracts the effects of the increasing f. Assuming a perfect cancellation, the weight-decrement rule, with $f(V_{gc}, V_{dc})=\rho$ a constant, models accurately the data described above.

$$\frac{\delta w}{\delta t} \approx -\frac{\kappa \rho}{Q_T} w^2 \quad (11)$$

To determine the electron tunneling portion of the learning rule equation, the temporal derivative of Eqn. (7) is taken, and the gate current is substituted using Eqn. (12), resulting in Eqn. (13).

$$I_g = \xi(V_{dg} + V_{bi})^2 e^{-\frac{V_o}{V_{dg} - V_{bi}}} \quad (12)$$

$$\frac{\delta I_s}{\delta t} = \frac{\kappa \xi}{Q_T} I_o (V_{dg} + V_{bi})^2 e^{\frac{\kappa' V_{in}}{U_t}} e^{\frac{\kappa Q_{fg}}{Q_T}} e^{-\frac{V_o}{V_{dg} + V_{bi}}} \quad (13)$$

By approximating $V_{db}+V_{bi}>>V_{gb}$ (where $V_{db}$ is the drain-to-bulk voltage, $V_{gb}$ is the gate-to-bulk voltage, and $V_{dg}=V_{db}-V_{gb}$), expanding the tunneling exponential, and solving for the weight-increment rule:

$$\frac{\delta w}{\delta t} \approx \frac{\kappa \xi}{Q_T} e^{\frac{-V_o}{V_{db}+V_{bi}}} (V_{dg} + V_{bi})^2 I_o^\sigma I_s^{(1-\sigma)} \quad (14)$$

where a is defined as $V_o U_t / \kappa (V_{db}+V_{bi})^2$. Because, for subthreshold source currents, the floating gate 214 voltage changes slowly, $(V_{dg}+V_{bi})^2$ is approximated to be constant. The constant terms are combined into a single parameter ε, and $I_s$ is replaced with w, yielding:

$$\frac{\delta w}{\delta t} \approx \varepsilon w^{(1-\sigma)} \quad (15)$$

Eqn. (15) models accurately the weight-increment data for subthreshold source currents. For source currents near threshold, however, the fit is poor. As the weight w increases, the floating gate 214 voltage increases, causing: (1) the tunneling current to decrease, and (2) the $\delta I_s/\delta Q_{fg}$ slope to decrease. Whereas this first effect is included in Eqn. (15), the second is not. Additionally, the approximation that $(V_{dg}+V_{bi})^2$ is a constant becomes less valid for above-threshold source currents. Therefore, Eqn. (15) is extended with the following approximation, which models accurately the weight-increment data for channel currents up to 1 μA:

$$\frac{\delta w}{\delta t} \approx (\Delta w)_{max} \frac{w^{(1-\sigma)}}{w_{corner} + w^{(1-\sigma)}} \quad (16)$$

The maximum weight change $(\Delta w)_{max}$, and the saturation weight value $w_{corner}$, are found by empirical measurement; the values vary with the tunneling voltage.

Finally, the complete synapse learning rule, Eqn. (17), is obtained by adding Eqns. (11) and (16):

$$\frac{\delta w}{\delta t} \approx (\Delta w)_{max} \frac{w^{(1-\sigma)}}{w_{corner} + w^{(1-\sigma)}} - \frac{\kappa \rho}{Q_T} w^2 \quad (17)$$

Equation (17) describes adequately the synapse learning for injection, tunnelling, and simultaneous injection and tunneling.

"Trapping"

SiO$_2$ trapping is well-known to those skilled in the art. In digital EEPROM memories, it ultimately limits the transistor life. In the synapse, trapping decreases the learning rate. However, unlike the transistors in a digital memory, the synapses in a typical learning system will transport only a few pC of total oxide charge over the system lifetime. One nC of gate charge was tunneled and injected; an about 20% drop in both the weight-increment and weight-decrement learning rates was measured. Because 1 nC of gate charge represents an enormous change in gate voltage, oxide trapping in the synapse can likely be ignored.

The present invention will facilitate the development of neural network integrated circuits. Since each cell requires only a single transistor, these networks can be made quite large. The moderately doped channel implant promotes operating these devices in the subthreshold (low inversion) MOS regime; the resulting power consumption is typically only 50 nW per cell. The empirically-developed learning rule can be used to predict and optimize synapse performance and application. Finally, since the present invention uses conventional BiCMOS fabrication techniques, such networks can be built today using existing commercial IC foundries and available processes.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for implementing a learning function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron injection, said electron injection further altering said stored charge value;

generating an output signal having a value dependent on the product of said stored charge value and said input signal.

2. The method for implementing a learning function according to claim 1 wherein said output signal is generated in the form of an electrical current.

3. The method for implementing a learning function according to claim 1 wherein said output signal is generated in the form of an electrical conductance.

4. The method for implementing a learning function according to claim 1 wherein said electron injection is controlled by altering said non-negative voltage applied to a second terminal.

5. A method for implementing a learning function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron tunneling, said electron tunneling further altering said stored charge value;

generating an output signal having a value dependent on the product of said stored charge value and said input signal.

6. The method for implementing a learning function according to claim 5 wherein said output signal is generated in the form of an electrical current.

7. The method for implementing a learning function according to claim 5 wherein said output signal is generated in the form of an electrical conductance.

8. The method for implementing a learning function according to claim 5 wherein said electron tunneling is controlled by altering said non-negative voltage applied to a second terminal.

9. A method for implementing a learning function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron tunneling and electron injection, said electron tunneling and said electron injection further altering said stored charge value;

generating an output signal having a value dependent on the product of said stored charge value and said input signal.

10. The method for implementing a learning function according to claim 9 wherein said output signal is generated in the form of an electrical current.

11. The method for implementing a learning function according to claim 9 wherein said output signal is generated in the form of an electrical conductance.

12. The method for implementing a learning function according to claim 9 wherein said electron tunneling and electron injection is controlled by altering said non-negative voltage applied to a second terminal.

13. A method for implementing a memory update function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron injection, said electron injection further altering said stored charge value;

generating an output signal having a value dependent on the product of said stored charge value and said input signal.

14. The method for implementing a memory update function according to claim 13 wherein said output signal is generated in the form of an electrical current.

15. The method for implementing a memory update function according to claim 13 wherein said output signal is generated in the form of an electrical conductance.

16. The method for implementing a memory update function according to claim 13 wherein said electron injection is controlled by altering said non-negative voltage applied to a second terminal.

17. A method for implementing a memory update function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron tunneling, said electron tunneling further altering said stored charge value;

generating an output signal having a value dependent on the product of said stored charge value and said input signal.

18. The method for implementing a memory update function according to claim 17 wherein said output signal is generated in the form of an electrical current.

19. The method for implementing a memory update function according to claim 17 wherein said output signal is generated in the form of an electrical conductance.

20. The method for implementing a memory update function according to claim 17 wherein said electron tunneling is controlled by altering said non-negative voltage applied to a second terminal.

21. A method for implementing a memory update function comprising the steps of:

applying a voltage to a first terminal;

applying a non-negative voltage to a second terminal;

accepting an input signal at a third terminal;

altering a stored charge value by capacitively coupling said input signal to said stored charge value;

initiating electron tunneling and electron injection, said electron tunneling and said electron injection further altering said stored charge value;

generating an output signal having a value dependent on the product of said stored charge value and said input signal.

22. The method for implementing a memory update function according to claim 21 wherein said output signal is generated in the form of an electrical current.

23. The method for implementing a memory update function according to claim 21 wherein said output signal is generated in the form of an electrical conductance.

24. The method for implementing a memory update function according to claim 21 wherein said electron tunneling and electron tunneling is controlled by altering said non-negative voltage applied to a second terminal.

* * * * *